United States Patent [19]

Terasaka et al.

[11] Patent Number: 4,897,290

[45] Date of Patent: Jan. 30, 1990

[54] METHOD FOR MANUFACTURING THE SUBSTRATE FOR LIQUID CRYSTAL DISPLAY

[75] Inventors: Toru Terasaka, Hachioji; Kazuo Arai, Seki; Kazuo Asano, Hachioji; Shinichi Nishi, Hino, all of Japan

[73] Assignee: Konishiroku Photo Industry Co., Ltd., Tokyo, Japan

[21] Appl. No.: 323,157

[22] Filed: Mar. 15, 1989

Related U.S. Application Data

[63] Continuation of Ser. No. 101,665, Sep. 28, 1987, abandoned.

[30] Foreign Application Priority Data

Sep. 26, 1986 [JP] Japan ............................. 61-226184
Jun. 17, 1987 [JP] Japan ............................. 62-148940

[51] Int. Cl.$^4$ .................. B05D 5/06; C23C 16/00; C23C 16/30; G02F 1/13
[52] U.S. Cl. .................................. 427/162; 350/340; 350/341; 427/166; 427/167; 427/255; 427/255.2; 427/255.6; 118/726
[58] Field of Search ............... 350/340, 341; 118/726; 427/162, 166, 167, 255, 255.2, 255.6

[56] References Cited

U.S. PATENT DOCUMENTS

| | | | |
|---|---|---|---|
| 3,046,839 | 7/1962 | Bird et al. | 350/320 |
| 4,084,884 | 4/1978 | Raynes | 350/341 |
| 4,705,359 | 11/1987 | Amstutz et al. | 350/341 |
| 4,775,223 | 10/1988 | Yoshinaga et al. | 350/340 |

FOREIGN PATENT DOCUMENTS

| | | | |
|---|---|---|---|
| 2817348 | of 0000 | Fed. Rep. of Germany | 350/341 |
| 24864 | 2/1979 | Japan . | |
| 107020 | 6/1985 | Japan . | |
| 203921 | 10/1985 | Japan . | |
| 5232 | 2/1986 | Japan . | |
| 1454296 | 11/1976 | United Kingdom . | |
| 2007865 | 5/1979 | United Kingdom | 350/341 |

OTHER PUBLICATIONS

*CRC Handbook of Chemistry and Physics*, 55th Edition, Editor Robert C. Weast, Ph.D, CRC Press, Ohio, 1974, Cover Page.

Primary Examiner—John S. Heyman
Assistant Examiner—Anita Pellman Gross
Attorney, Agent, or Firm—Finnegan, Henderson, Farabow, Garrett and Dunner

[57] ABSTRACT

A method for fabricating an alignment layer on a substrate of a liquid crystal display device which includes aligning the center line of the substrate such that it lies substantially along a line that passes through the center of and perpendicular to a linear source. The substrate is then rotated about its center line to a desired angle, and the source material is vacuum deposited onto the substrate.

61 Claims, 7 Drawing Sheets

FIG. 7
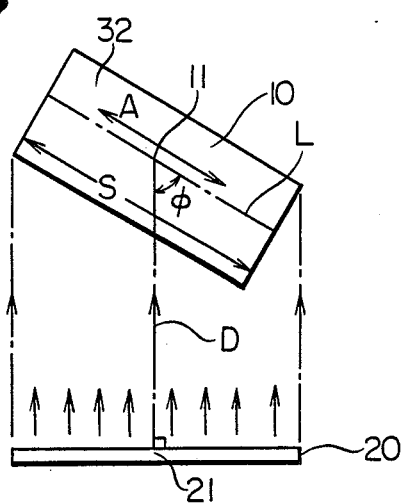
FIG. 8
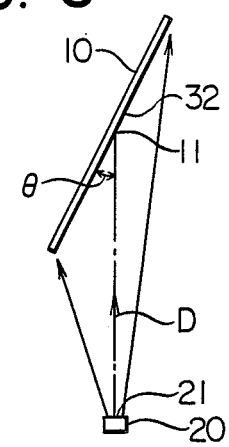
FIG. 9
FIG. 10
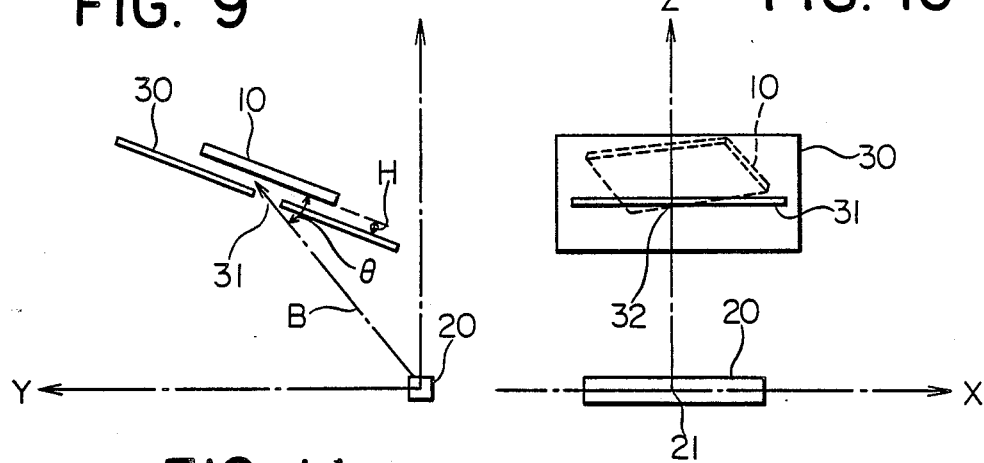
FIG. 11
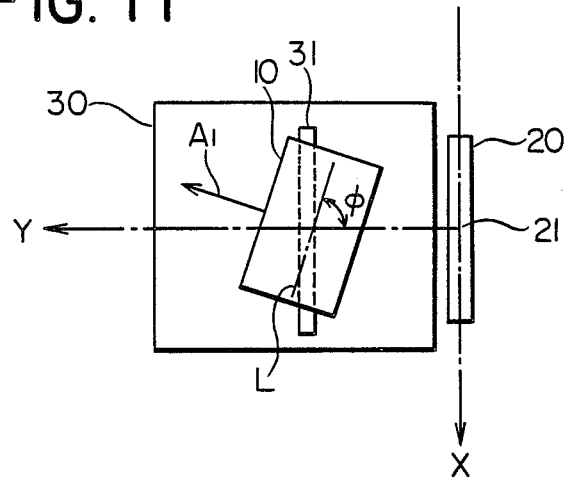

FIG. 19 (A)
FIG. 19 (B)
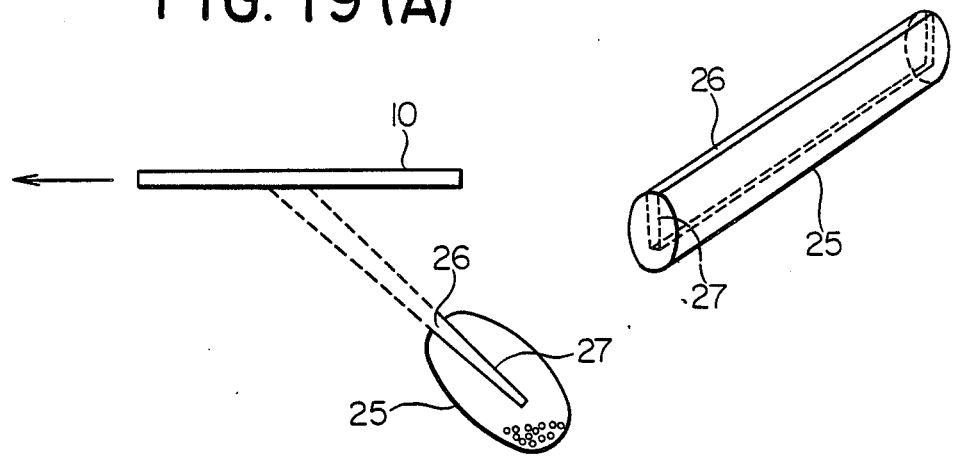
FIG. 20
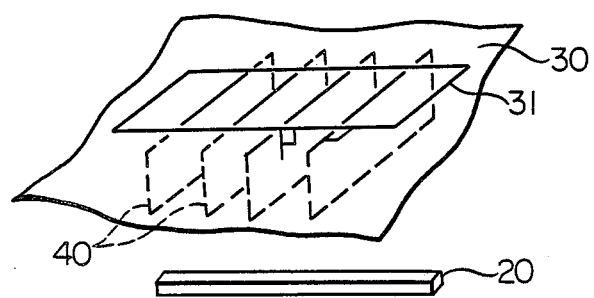

METHOD FOR MANUFACTURING THE SUBSTRATE FOR LIQUID CRYSTAL DISPLAY

This application is a continuation of application Ser. No. 101,665, filed 09/28/87, now abandoned.

FIELD OF THE INVENTION

This invention relates to a method for the manufacture of a substrate suitable for liquid crystal display devices.

BACKGROUND OF THE INVENTION

Liquid crystal display devices, by virtue of their low power consumption, low production costs, light weight and low profile feasibilities, ready color display capabilities, and other advantageous features, have come to be employed for the increasingly further diversified applications of late.

The liquid crystal display device is usually configured of a pair of substrates each having an electrode layer and alignment layer, and a liquid crystal substrate sandwiched and sealed therebetween.

Known alignment layer forming methods include the vacuum evaporation depositing process, rubbing process, and various other techniques, of which the vacuum evaporation depositing process serves particularly advantageously to form the super-twisted type of liquid crystal display devices having a large liquid crystal molecular twist angle ranging from 180° to 360° (Japanese Patent O.P.I. Publications Nos. 107020/1985 and 203921/1985) for example, by virtue of a relatively large pretilt angle (formed by the direction of liquid crystal molecular directors in contact with the alignment layer surface of a substrate and the substrate surface) that the process provides.

Conventionally, the following vacuum evaporation depositing methods have been known to be employed for forming the alignment layer of liquid crystal display devices:

(1) A method that uses a point source for the evaporation source (2) A method that applies an iris-controlled vapor particulate beam to the substrate being slide-shifted in the process in a vertical attitude to the evaporation depositing direction (Japanese Patent O.P.I. Publications Nos. 5232/1986 and 24864/1979).

(3) A method that, by using a specifically formed slit through which to transmit depositing vapor particles, vertically slide-shifts the substrate in a warped posture (Japanese Patent O.P.I. Publication No. 5232/1986).

By method (1) above, however, the closer to the end of a substrate, the greater will deviations be between the actual depositing direction and an anticipated one, although in a central area of the substrate, such deviations may be minimized and high accuracy depositions made in the anticipated direction. Accordingly, the resultant alignment angle of a liquid crystal display device will vary, depending on the local substrate area, and in consequence, the contrast ratio, threshold voltage, and other substrate parameters will be disuniformized, raising a problem of degraded display capabilities.

By method (2) above, as described in Japanese Patent O.P.I. Publication No. 5232/1986, since the substrate is slide-shifted in a vertical attitude to the evaporation depositing direction, the evaporation depositing directional angle may be uniformized but the evaporation depositing angle and layer thickness will tend to be disuniformized, rasing a problem of as yet insufficient display capabilities.

By method (3) above, as described in Japanese Patent O.P.I. Publication No. 5232/1986, since a specifically formed slit is employed and the substrate slide-shifted vertically to the evaporation depositing direction in a warped posture, an alignment layer may be formed with its evaporation depositing directional angle, evaporation depositing angle, and layer thickness all duly uniformized, but on the other side of the coin, the method requires manufacturing equipment of considerable complexity for its implementation, raising a problem in the difficulty of its commercialization.

SUMMARY OF THE INVENTION

This invention has been completed by the situation described above, and, thus the object of the invention is to provide a method of manufacturing a substrate advantageously applicable to liquid crystal display devices and capable of producing liquid crystal display devices that are uniform in the alignment angle distribution through a simple process requiring less complex equipment.

Directed toward the manufacture of liquid crystal display devices including the formation of an alignment layer on the substrate by a vacuum deposition process, the method of the present invention is characterized by employing a linear evaporation source that meets requirement (1) described below, and arranging the substrate in a manner that meets requirement (2) described below, to form an alignment layer on said substrate by a vacuum deposition process. Requirement (1)

The linear deposition source employed has a length which at least corresponds to that of the substrate in a direction in which the uniform deposition is required. Requirement (2)

The substrate is placed opposite to and within the length of the linear deposition source and the vacuum deposition is effected by an oblique vacuum deposition process, in which said substrate is placed so that the angle formed by the direction of a source material flown at the right angle from the linear deposition source and the plane of the substrate is not a right angle.

BRIEF DESCRIPTION OF THE DRAWINGS

FIGS. 9 through 11 are the front, side, and plan views respectively that outline one of preferable embodiment of the present invention, and FIG. 12 is an explanatory drawing showing interrelations of the linear opening and evaporation depositing angle $\theta$ of a control member, while FIG. 19 (A) and 19 (B) are the cross-sectional and slanted views respectively of another structural example of the linear evaporation source, and FIG. 20 the slanted view of a directional control plate.

| 10 | Substrate | 20 | Linear Evaporation Source |
|---|---|---|---|
| 11 | Center of Substrate Center Line | 21 | Center of Linear Evaporation Source |
| 30 | Control Member | 31 | Linear Opening |
| 32 | Center | 33 | Edge of the Opening |
| 34 | Edge of the Opening | | |
| L | Substrate Center Line | D | Evaporation Depositing Direction |
| $\phi$ | Angle of Evaporation Depositing Direction | $\theta$ | Evaporation Depositing Angle |
| 41 | Upper Substrate | 51 | Lower Substrate |
| 42,52 | Support Plates | 43,53 | Electrode Layers |
| 44,54 | Alignment Layers | 63 | Liquid Crystal Layer |
| 71 | Front Polarization Element | 72 | Rear Polarization Element |
| 73 | Reflective Plate | | |
| 80 | Point Evaporation Source | | |

DETAILED DESCRIPTION OF THE INVENTION

According to the method of the present invention, not only is the length of a linear evaporation source employed made to correspond to the substrate length in a direction in which the uniform deposition on the said substrate surface will be required (requirement (1)), but the substrate center line in a direction in which the uniform evaporation depositing on the substrate surface will be required, the evaporating direction of the linear evaporation source, and the linear evaporation source itself are also laid out roughly to belong on one and the same plane, and in addition, said substrate is positionally fixed relative to said evaporation source in a manner for said evaporating direction and said evaporation source to intersect each other at approximately right angles (requirement (2)), to have an alignment layer formed by a vacuum evaporation deposition process, so that despite the simplicity of the method, an alignment layer having uniform alignment angles at high precision in the direction in which the uniform evaporation depositing on the substrate surface will be required may be formed, and in consequence, liquid crystal display devices uniform in contrast ratio, threshold voltage, and other parameters manufactured.

Figure 1:
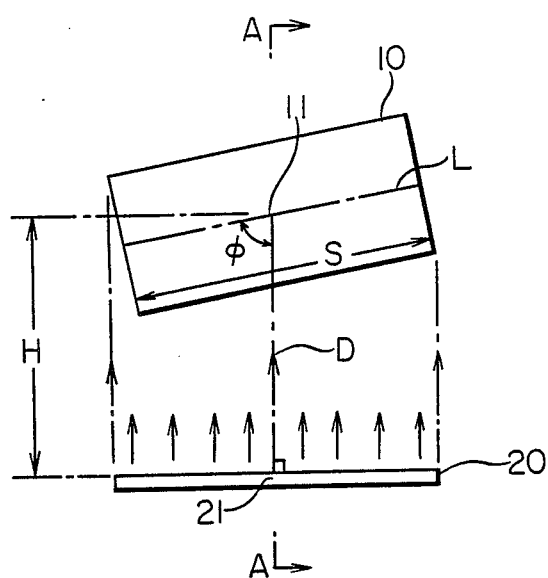
FIGS. 1 and 2 are the front and longitudinally cross-sectional views respectively outlining an example embodiment of this invention shown for explanatory purposes, FIGS. 3 through 5 views outlining other example embodiments of this invention for explanatory purposes, FIG. 6 a cross-sectional view of the liquid crystal display device showing its structure for explanatory purposes, and FIGS. 7 and 8 the front and side views respectively outlining a specific example embodiment of this invention shown for explanatory purposes.
Figure 2:
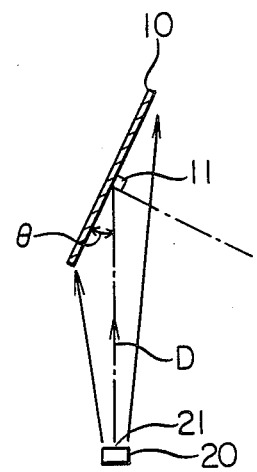

This invention is next described specifically below. FIGS. 1 and 2 are the front and A—A cross-sectional views respectively that schematically illustrate the method of this invention.

In these figures, 10 indicates a substrate, 20 a linear evaporation source, L an imaginary center line in a direction in which the uniform deposition is required, and D the flow direction from the linear evaporation source. Symbol $\phi$ indicates an evaporating direction angle, that is, the angle formed by substrate center line L and evaporating direction D. Symbol $\theta$ indicates an evaporation depositing angle, that is, the angle formed by evaporating direction D and its projected component on the substrate surface, at center 11 of substrate center line L.

Under this invention, linear evaporation source 20 that meets requirement (1) described below is employed, and by laying substrate 10 out relative to said linear evaporation source 20 in a manner that meets requirement (2) described below, an alignment layer will be formed on said substrate by a vacuum evaporating depositing process. Requirement (1)

The length of linear evaporation source 20 shall correspond to length S of substrate 10 in a direction in which the uniform evaporation depositing on the said substrate 30 surface will be required. Requirement (2)

Center Line L of a substrate in a direction in which the uniform evaporation depositing on the substrate surface will be required, evaporating direction D of linear evaporation source 20, and said linear evaporation source 20 shall roughly be laid out to belong on one and the same plane, and said substrate 10 shall positionally be fixed relative to said linear evaporation source 20 in a manner for said evaporating direction D and said linear evaporation source 20 to intersect each other at approximately right angles.

In the above description, the length of linear evaporation source 20 corresponds to length S of substrate 10, but the two need not precisely coincide with each other, and the former needs only to be a length equaling 80 to 120% of said length S. Specifically, the length should preferably be set to hold deviations between the actually evaporation deposited directional angle and an anticipated evaporation depositing directional angle within a commercially tolerable range.

The substrate 10 is preferably positioned in a manner to have center 11 of its center line L located on an extension of evaporating depositing direction D that passes through center 21 of linear evaporation source 20. By laying the substrate out at such a preferred position, the length required of linear evaporation source 80 can be shortened, permitting alignment layers to be produced at lower cost.

Evaporation deposition directional angle $\phi$ and evaporation deposition angle $\theta$ are not partcilualry limited, but may appropriately be selected on the basis, for example, of required parameters of the liquid crystal display device.

Actually, evaporation deposition directional angle $\phi$ is selected to have the optimum visibility direction of the liquid crystal display devices to be manufactured coincide with their reference view angle direction, and is, for example, preferably set in the vicinity of 45° in the case of a 90° twisted nematic type or a 270° super-twisted type of liquid crystal display devices.

Meanwhile, evaporation deposition angle $\theta$ is set on the basis of the magnitude of a required pretilt angle. In the case of a super-twisted type of liquid crystal display devices of which a large pretilt angle is required, for example, an angle ranging from 5° to 15° will be suitable, while in the case of liquid crystal display devices of which only a small pretilt angle is required, an angle ranging from 25° to 45° will be appropriate.

The thickness of alignment layers, may range from 300Å to 2,500Å at center 11 of substrate 10 and 500Å to 1,200Å is more preferable. An insufficient thickness of alignment layers provides lower liquid crystal aligning power, which gives rise to the generation of uneven alignments. An excessive thickness of alignment layers, on the other hand, attenuates liquid crystal driving voltages, and may degrade the voltage versus optical variation characteristics or response characteristics of resultant liquid crystal display devices.

The longer the distance H from linear evaporation source 20 to center 11 of substrate center line L of substrate 10, the higher will the accuracy be at which evaporation depositing angle θ may be uniformized over the entire surface of substrate 10, and in practice, a distance two to six times as long as the substrate 10 length in evaporation depositing direction D is sufficient.

The specific structure of linear evaporation source 20 is not particularly restricted, but may be formed, for example, with an elongated evaporation source vessel and orifices opening into the vessel. For physical configurations of the orifices, a slit, the row of tiny holes laid out in a straight line, or similar other configurations may be employed. When arranging tiny holes in a row, the hole spacing should preferably be 1/10 or less of evaporation depositing distance H.

As for the evaporation source vessel material, no particular limitations are imposed, and, for example tantalum, molibdenum, tungsten, or the like may be employed.

As another alternative, a linear evaporation source with deposition vapor control members consolidated together with the vessel may also be employed. Specifically, as shown in FIGS. 19 (A) and 19 (B), linear opening 26 may be provided to extend longitudinally along the wall of a long tubular evaporation, source vessel 25, and deposition vapor flow control members 27 consisting of a pair of plates projecting from the tubular wall area that forms said opening 26 may additionally be provided, together to configure linear evaporation source 20. Thus, the deposition vapor flow may also be regulated in a predesignated direction by employing linear evaporation source 20 for which deposition vapor flow control members 27 have been consolidated with evaporation source vessel 25 to form a one-piece unit.

Regarding the evaporation depositing material, no particular restrictions are imposed, and actually SiO, MgO, $MF_2$, or equivalent, or even an organic material composed of imide type or amide type polymers may for example be employed.

With regard the material of substrates 10, no particular restrictions are levied either, and glass, plastic resins, etc. may be employed. In addition, an evaporation depositing area regulating mask may also be provided on top of substrate 10.

Figure 3:
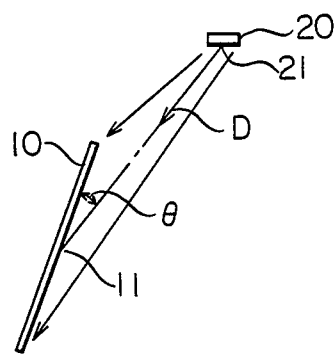
Figure 4:
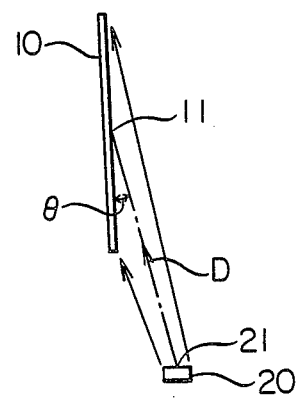

FIGS. 3 and 4 each schematically illustrate other embodiment of the present invention. In FIG. 3, substrate 10 is positioned below linear evaporation source 20 at an angle, for the formation of an alignment layer. In FIG. 4, substrate 10 is positioned above linear evaporation source 20 at an angle, for the formation of an alignment layer. In these examples, evaporation depositing direction D is at an angle. Under this invention, substrate 30 may thus be positioned either above or below linear evaporation source 80, whichever preferred.

Figure 5:
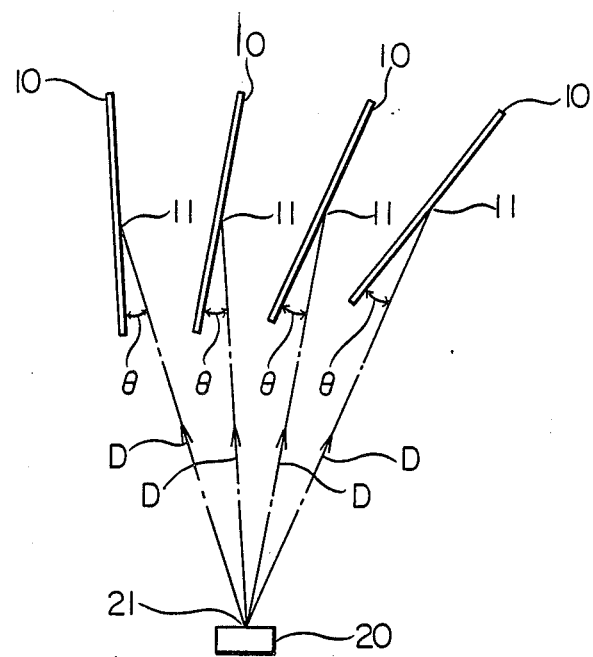

FIG. 5 shows still another embodiment of the present invention. In this example, multiple substrates 10 have been laid out above a linear evaporation source that serve them all in common, and an alignment layer formed simultaneously on each of the multiple substrates 10. Here, linear evaporation source 20 that meets said requirement (1) against each and every one of the multiple substrates 10 that in turn have been laid out and fastened down in a manner to individually meet said requirement (2) against the common linear evaporation source 20. Such an alignment layer formin process applied simultaneously to multiple substrates 10, with linear evaporation source 20 serving them all in common, significantly enhances the production efficiency.

Figure 6:
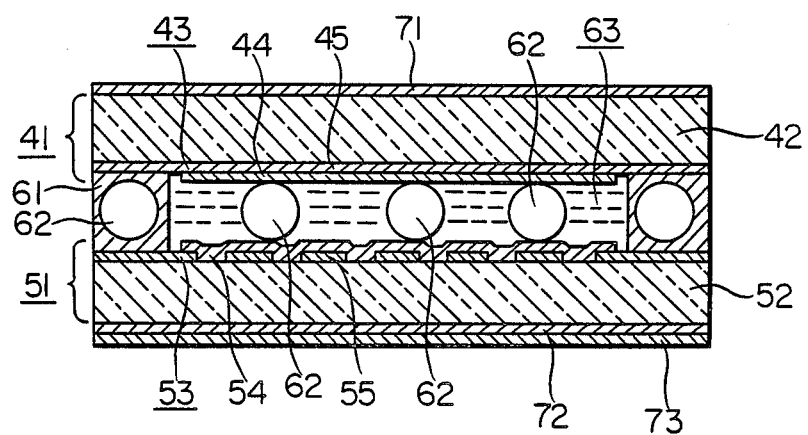

FIG. 6 shows the specific structure of an example liquid crystal display device built with component devices having a substrate with its alignment layers formed by the process described above, presented for explanatory purposes. In this example liquid crystal display device, upper substrate 41 and lower substrate 51 have been spaced apart from each other, where upper substrate 41 consists of electrode layer 43 provided on the inner surface of support plate 42 and alignment layer 44 formed in conformance with this invention, and lower substrate 51 consists of electrode layer 53 provided on the inner surface of support plate 52 and alignment layer 54 formed in conformance with this invention.

The space inbetween upper substrate 41 and lower substrate 51 has been sealed with sealer block 61, to configure a liquid crystal display device. Inside the liquid crystal display device, multiple spacers 62 have been laid out to be mutually spaced apart, and the remaining space filled with a liquid crystal material to form liquid crystal layer 63.

Over the outer surfaces of upper substrate 41 and lower substrate 51, front polarizing optical element 71 and rear polarizing optical element 72 have respectively been provided. Shown in the same cross-sectional view, 73 indicates a reflective plate provided to cover the outer surface of rear polarizing element 72. This reflective plate 73 is omitted in a transmitting type of liquid crystal display devices.

As the constituent material of support plates 42 and 52, soda-lime glass, borosilicate glass, quartz glass, or similar; plastic sheets made of uniaxially drawn polyethylene terephthalate, polyether sulphone, polyvynil alcohol, or equivalent; metallic sheets made of aluminum, stainless steel, or equivalent; or similar may be employed.

Electrode layers 43 and 53 consists of clear electrodes 45 and 55 made, for example, of 1000Å thick ITO (an oxide of tin and indium) provided over, and inparallel with but spaced apart from, support plates 42 and 52 made, for example, 1.1 mm thick, where clear electrode 45 constituting one of the electrode layers, 43, and clear electrode 55 constituting the other electrode layer, 53, have been laid out to be orthogonally oriented with each other, to form a matrix type of display electrodes consisting, for example, of 0.3 mm×0.3 mm picture element electrodes.

Alignment layers 44 and 55 are formed by a manufacturing method under this invention out of SiO employed as the evaporation deposition material, at a 6° evaporation deposition angle for example, and made 800Å thick for example.

Upper substrate 41 and lower substrate 51 may additionally be provided with a dielectric layer, alkali ionic migration preventive layer, reflection preventive layer, polarization layer, reflective layer, and/or other layers, as required.

Front polarization element 71 consists for example of the "F-1205DU" (made by Nitto Denko), while rear polarization element 72 and reflective plate 73 both consist for example of the "F-3205M" (made by Nitto Denko).

Spacer 62 is made for example out of the "PF-60S" fiber glass (made by Nippon Electrical Glass), and sealer block 61 out of the "XN-5A-C" Structbond (made by Mitsui Toatsu Kagaku).

As the liquid crystal forming material to form said liquid crystal layer 63, any material conventionally employed for similar applications may be employed and no particular restrictions are levied thereon. Specifically, nematic liquid crystals, chiral-nematic liquid crystals, smectic liquid crystals, cholestric liquid crystal, chiral-smectic liquid crystals, or any other well-known liquid crystals, as well as any of their combinations, may be employed.

As for display modes, any of the twisted nematic (TN) type modes, guest host (GH) type modes, voltage-controlled (electrically controlled) birefringence (ECB) modes, cholestric-nematic type phase transition modes, dynamic scatter (DS) modes, and the like may be employed.

The present invention is further described below with reference to preferable embodiments.

FIGS. 9 through 11 are the explanatory views outlining preferable embodiment of the present invention, where FIG. 9 gives its view from the X axis direction, FIG. 10 that from the Y axis direction, and FIG. 11 that from the Z axis direction.

In these figures, 10 indicates a substrate, 20 a linear evaporation source, 30 a control member, 31 a linear opening for the passage of an evaporation deposition material, L the longitudinal center line of the substrate, and B the evaporation depositing direction. Symbol $\phi$ indicates the evaporation depositing directional angle, that is, an angle formed by substrate center line L and the projection on the substrate surface of evaporation depositing direction B, and $\theta$ the evaporation depositing angle, that is, an angle of intersection by evaporation depositing direction B with the surface of substrate 10.

In the illustrated example, the longitudinal orientation of linear evaporation source 20 has been made to coincide with the X axis, and center 21 of said linear evaporation source 20 positioned at the point of origin of the X axis. Control member 30 has been located inbetween substrate 10 and linear evaporation source 20, and positioned to make linear opening 31 of said control member 30 parallel with linear evaporation source 20, and to have center 32 of said linear opening 31 roughly belong on the YZ plane.

This invention stipulates linear evaporation source 20 and control member 30 to be arranged in the above described layout, and an alignment layer made of evaporation-deposited component layers to be formed, not only by having the deposition vapor from linear evaporation source 20 pass through linear opening 31 of control member 30, but also by having the deposition vapor flow hit the surface of said substrate 10 through slide-shifting substrate 10 in a manner to cut across the deposition vapor flow that has passed through said linear opening 31.

The slide-shifting direction of substrate 10 may be arbitrarily defined, as long as evaporation depositing directional angle $\phi$, evaporation depositing angle $\theta$, and spacing H between substrate 10 and linear opening 31 of control member 30 are held steady during the slide-shifting process. As indicated by arrow mark A1 in FIG. 11, substrate 10 is slide-shifted in the example under discussion with the long side of substrate 10 leading, and in a direction along its short side and parallel to the surface of control member 30.

Figure 12:
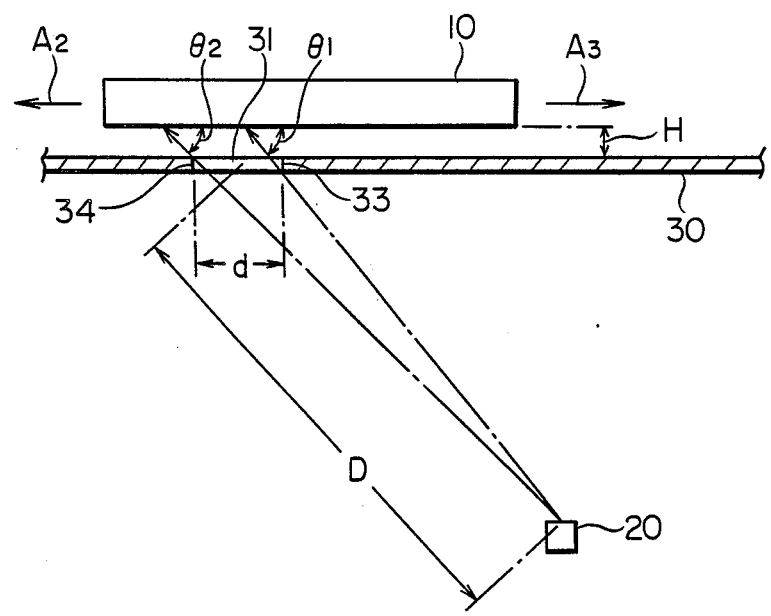

As shown in the FIG. 12 enlarged view, such a slanted deposition process limits the flight direction of a deposition vapor flow passing through linear opening 31 within an angle ranging from $\theta 1$ to $\theta 2$ as regulated by one edge 33 and the other edge 34 which together form linear opening 31. Accordingly, when substrate 10 is slide-shifted in a direction indicated by arrow mark A2, for example, angle $\theta 2$ will regulate evaporation depositing angle $\theta$, and when it is slide-shifted in a direction indicated by arrow mark A3, angle $\theta 1$ will regulate evaporation depositing angle $\theta$.

Thus, by appropriately selecting the substrate 10 slide-shifting direction, evaporation depositing angle $\theta$ may be determined with either $\theta 1$ or $\theta 2$ whichever applicable. The magnitude of $\theta 1$ and $\theta 2$ may be determined by appropriately selecting width d of linear opening 31 of control member 30, and spacing D between said linear opening 31 and linear evaporation source 20.

The greater the spacing between substrate 10 and linear evaporation source 20, the more uniformly over an entire substrate surface may evaporation depositing directional angle $\phi$ be distributed, but in practice, as long as it is at least double the diagonal length of the substrate, the evaporation depositing direction may be distributed to be sufficiently uniform for commercial applications. On the other hand, to minimize the influence of heat from an evaporation source, the substrate to evaporation source spacing should preferably be made at least 30 cm.

Furthermore, directional control plates 40 may also be provided inbetween control member 30 and linear evaporation source 20 to directionally regulate the deposition vapor flow for even higher uniformity of the evaporation depositing directional angle. As shown in FIG. 20, directional control plates 40 should preferably be vertically oriented to linear opening 31 of control member 30.

The substrate 10 slide-shifting speed should be determined in view of width d of linear opening 31, the layer forming speed, and the alignment layer thickness. Where, for example, the deposition vapor flow is held steady in flow rate, a steady layer forming speed may be achieved by holding the slide-shifting speed steady, and where the deposition vapor flow fluctuates, the slide-shifting speed may be varied in accordance therewith to maintain the uniformity.

The length of linear opening 31 should be selected to permit the entire surface of substrate 10 to evenly pass directly above said linear opening 31. Specifically, it should be a length to expose the entire surface of substrate 10 to a deposition vapor flow, and should be determined in view of evaporation depositing directional angle $\phi$ and the slide-shifting direction of substrate 10. The size of control member 30 is only stipulated to be large enough to prevent the deposition vapor flow out of linear evaporation source 20 from reaching substrate 10 via any other path than through linear opening 31, and its physical configurations may be made planar or in any other form.

The length of linear evaporation source 20 should preferably equal that of linear opening 31 of control member 30, but roughly 80 to 120% of the diagonal length of substrate 10 will be sufficient. Specifically, the length should preferably be set to hold deviations between the actual evaporation depositing directional angle and an anticipated one within a commercially tolerable range.

Where spacing D between linear opening 31 of control member 30 and linear evaporation source 20 is long, the length of linear evaporation source 20 may be set to be relatively short, but where spacing D is short, the length of linear evaporation source 20 should at least equal that of linear opening 31.

In this case, too, no particular restrictions are imposed on evaporation deposition directional angle φ or evaporation deposition angle θ, but these parameters may appropriately be selected on the basis, for example, of the performance demanded of liquid crystal display devices. In other words, evaporation depositing directional angle φ is often selected to have the optimum visibility direction of end liquid crystal display devices coincide with a reference view angle direction. Evaporation depositing angle θ is set on the basis of the required pretilt angle magnitude, and is usually selected from a 1° to 50° range.

The substrate 10 material is not particularly restricted, and glass, a plastic resin, or equivalent may be employed therefor. A mask may also be provided over substrate 10 to the formation on the substrate 10 surface in advance will be required of either electrode layers for the liquid crystal drive or drive devices.

Figure 13:
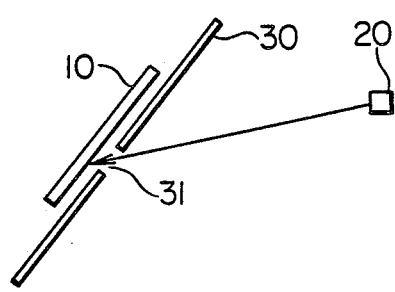
FIGS. 13 through 15 show other preferable embodiments of the present invention.
Figure 14:
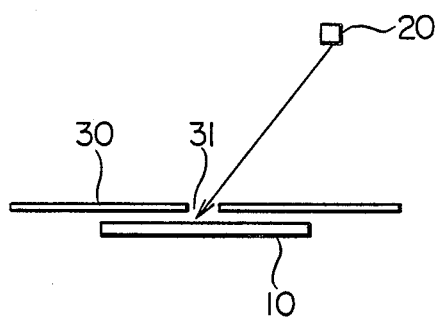

No vertical interrelations are paticularly imposed among substrate 10, linear evaporation source 20, and control member 30. As shown in FIGS. 13 and 14, linear evaporation source 20 may for example be positioned above substrate 10 and control member 30, at a slanting angle.

Figure 15:
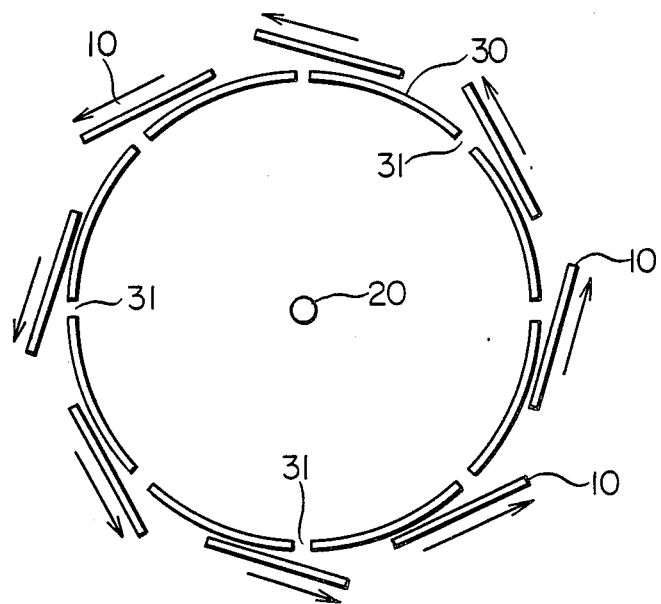

As shown in FIG. 15, another alternative is to provide ringlike control members 30 surrounding a single linear evaporation source 20, to equip them with multiple linear openings 31, and by using the same number of substrates 10 as these linear openings 31, to have alignment layers formed on these substrates 10 simultaneously.

Under this invention, a pair of substrates each with an alignment layer formed thereon by the process described above is used to build a liquid crystal display device. No particularly restricted structure is imposed on liquid crystal display devices for which a variety of configurations may be employed, nor is the liquid crystal particularly limited, permitting the use of a variety of liquid crystal types.

Now, actual embodiment examples of this invention are described below, but in no way will applications of this invention be limited by such example embodiments.

EXAMPLE 1

As shown in FIGS. 7 and 8, a glass substrate (12 cm long and 24 cm wide) has been employed for substrate 30 with surface 32 covered by a patterned electrode layer (not illustrated), and a linear evaporation source (with its orifice opening 26 cm long and 1.5 mm wide, and a vessel 5 mm deep) having a length that corresponds to length S of said substrate 30 in the direction (arrow A) in which the uniform evaporation depositing on the said substrate 30 surface will be required, for linear evaporation source 80. Said substrate 30 has then been positionally fixed above linear evaporation source 80 in an attitude to have substrate center line L in the direction in which the uniform evaporation depositing on the substrate 30 will be required, evaporation depositing direction D of linear evaporation source 80, and evaporation source 80 itself belong roughly on one and the same plane, and to have evaporation depositing direction D and linear evaporation source 80 intersect each other at approximately right angles.

Evaporation depositing directional angle φ has been made 45° against substrate center line L, and evaporation depositing angle θ, or the angle formed at center 31 of substrate center line L by evaporation depositing direction D and its component projected on the substrate surface, made 6°. In addition, substrate 30 has also been arranged to have center 31 of its center line L positioned on an extension of evaporation depositing direction D at center 81 of linear evaporation source 80.

It was with substrate 30 and linear evaporation source 80 thus laid out that an alignment layer has been formed on surface 32 of substrate 30 by a vacuum evaporation depositing process.

Conditions employed for the vacuum evaporation depositing process have been as follows:
Evaporation Depositing Material: SiO
Substrate 30 Temperature: Room temperature
Vacuum Level: $3.5 \times 10^{-6}$ torr
Distance H from Linear Evaporation Source 80 to Center 31 of Substrate 30: 70 cm
Evaporation Depositing Speed: 5Å/sec Two substrates with an alignment layer formed by the above process have been used, one for the upper substrate and the other for the lower, and a liquid crystal display device similarly structured to the one shown in FIG. 6 built. This device will hereinafter be referred to as "liquid crystal display device A".

For the liquid crystal forming substance to constitute liquid crystal layer C, the "ZLI-2293" nematic liquid crystal material (made by Merck) with the "S-811" optical rotator (made by Merck) added on has been employed.

Liquid crystal display device A has then been driven by a multiplex drive system at a 1/100 duty rate, to measure the contrast ratio (ratio of the luminance of reflected rays in a select (dark) mode to that in a non-select (light) mode) and threshold voltage at various locations on the device. The measurements taken have revealed 1% or less dispersions along substrate center line L of the liquid crystal display surface, testifying to a high level of uniformity achieved.

EXAMPLE 2

Alignment layers have been formed on substrates by the same process as for Example 1 except altering evaporation depositing directional angle φ to 90° and evaporation depositing angle θ to 10°, and a liquid crystal display device built with thus prepared substrates in a manner similar to Example 1. This device will hereinafter be referred to as "liquid crystal display device B".

Liquid crystal display device B has then been driven and measured as to the contrast ratio and threshold voltage at various locations of its display surface, in a similar manner to Example 1. The measurements taken have revealed hardly any dispersions along substrate center line L of the liquid crystal display surface, testifying to a high level of uniformity achieved.

COMPARATIVE EXAMPLE 1

Alignment layers have been formed on substrates 30 by a process similar to that employed for Example 1 except the use of a point evaporation source in lieu of linear evaporation source 80. The point evaporation source has been positioned directly below center 31 of substrate center line L of substrate 30.

Then by using two substrates each with an alignment layer formed by the process described above, a liquid crystal display device has been built similarly to Example 1. This device will hereinafter be referred to as "contrasting liquid crystal display device 'a'".

Comparative liquid crystal device 'a' has then been driven and measured as to the contrast ratio and threshold voltage at various locations of its display surface, in a manner similar to Example 1. The measurements taken have revealed 6% or greater dispersions along substrate center line L of the liquid crystal display surface, with the dispersions in contrast ratio and threshold voltage made increasingly greater along with the distance away from center 31 of substrate center line L, and have shown the device to be inferior in the uniformity of its local parameters.

EXAMPLE 3

Figure 16A:
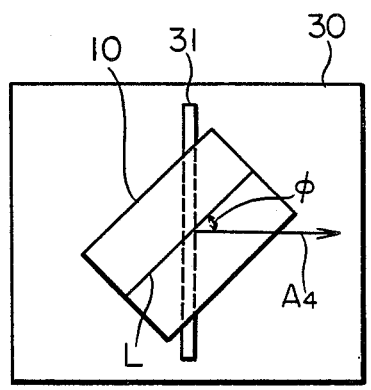
FIG. 16 (A) and 16 (B) are the plan and front views respectively of one of preferable embodiment of the present invention and FIG. 17 (A) and 17 (B) the plan and front views respectively of another embodiment while FIG. 18 (A) and 18 (B) are the plan and front views respectively of a comparative example.
Figure 16B:
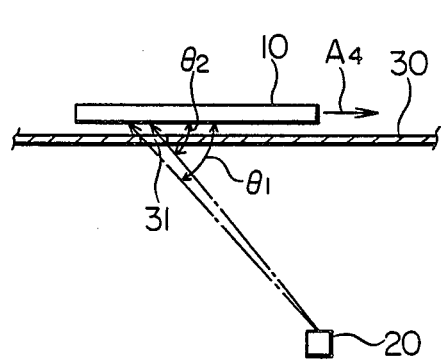

Substrate 10
  A glass substrate 12 cm long and 24 cm wide, with an ITO-made clear electrode provided on its surface
Linear Evaporation Source 20
  Evaporation Depositing Material: SiO
  Vessel: A tantalum container 15 mm deep with its opening 26 cm long and 1.5 mm wide
Control Member 30
  A control member 40 cm wide having linear opening 31 made 26 cm long The above substrate 10, linear evaporation source 20, and control member 30 have been laid out as shown in FIGS. 16 (A) and 16 (B), and in accordance with the below listed evaporation depositing conditions, an alignment layer formed on the substrate surface by a slanted vacuum evaporation depositing process.

Angle $\theta_1$: 7°
Angle $\theta_2$: 7.5°
Evaporation Depositing Directional Angle $\phi$: 45°
Spacing D between Linear Evaporation Source 20 and Linear Opening 31: 60 cm
Substrate 10 Slide-Shifting Direction: Vertical to linear opening 31 (Arrow A4 Direction)
Substrate 10 Slide-Shifting Speed: 2.5 cm/min
Layer Forming Speed: 10Å/sec
Substrate Temperature: Room temperature
Vacuum Level: $3.5 \times 10^{-6}$ torr The alignment layer formed under the above conditions has been uniform in layer thickness and layer growth direction.

Two substrates with the above alignment layer formed thereon have then been combined together to build a liquid crystal display device, and upon running drive tests thereon, the threshold voltage has been found uniformly distributed over the entire substrate surface. Upon measuring the pretilt angle of liquid crystal molecules, it has been found to be at 33° and highly uniformly distributed.

EXAMPLE 4

Figure 17A:
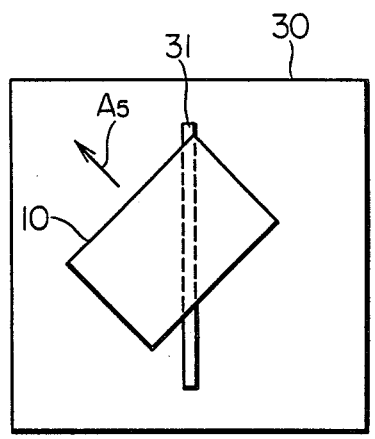
Figure 17B:
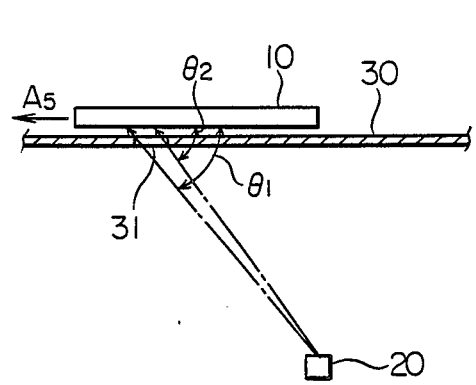

Substrate 10
  A glass substrate 12 cm long and 24 cm wide, with an ITO-made clear electrode provided on its surface
Linear Evaporation Source 20
  Evaporation Depositing Material: SiO
  Vessel: A tantalum container 15 mm deep with its opening 26 cm long and 1.5 mm wide
Control Member 30
  A control member 40 cm wide having linear opening 30 made 26 cm long The above substrate 10, linear evaporation source 20, and control member 30 have been laid out as shown in FIGS. 17 (A) and 17 (B), and in accordance with the below listed evaporation depositing conditions, an alignment layer formed in a similar manner to Example 1.

Angle $\theta_1$: 5°
Angle $\theta_2$: 10°
Evaporation Depositing Directional Angle $\phi$: 45°
Spacing D between Linear Evaporation Source 20 and Linear Opening 31: 60 cm
Substrate 10 Slide-Shifting Direction:
  In a direction with the longer side of substrate 10 leading that makes the longitudinal orientation of substrate 10 and linear opening 31 intersect each other at 45° (Arrow A5 Direction)
Substrate 10 Slide-Shifting Speed: 26 cm/min
Layer Forming Speed: 10Å/sec
Substrate Temperature: Room temperature
Vacuum Level: $3.5 \times 1^{-6}$ torr The alignment layer formed under the above conditions has been uniform in layer thickness and layer growth direction.

Two substrates with the above alignment layer formed thereon have then been combined together to build a liquid crystal display device, and upon running similar drive tests thereon to those on Example 3, the threshold voltage has been found uniformly distributed over the entire substrate surface. The pretilt angle of liquid crystal molecules has also been found highly uniformly distributed at 42°.

EXAMPLE 5

An alignment layer has been formed by a similar process to Example 1, except for the below listed parameter changes.

Width of Linear Opening 31: 17 cm (Spacing D: 60 cm)
Angle $\theta_1$: 6°
Angle $\theta_2$: 8°
Substrate 10 Slide-Shifting Speed: 10.3 cm/min (with the slide-shifting direction remaining unchanged from Example 3)

The alignment layer formed under the above conditions has been uniform in both layer thickness and layer growth direction.

Two substrates each with the above alignment layer formed thereon have then been combined together to build a liquid crystal display device, and upon running drive tests thereon, the threshold voltage has been found uniformly distributed over the entire substrate surface. Upon measuring the pretilt angle of liquid crystal molecules, it has been found to be at 30° and highly uniformly distributed.

EXAMPLE 6

An alignment layer has been formed by a similar process to Example 5, except in a reverse substrate 10 slide-shifting direction. The alignment layer formed by the above process has been uniform in both layer thickness and layer growth direction.

Two substrates each with the above alignment layer formed thereon have then been combined together to build a liquid crystal display device, and upon running drive tests thereon similarly to Example 3, the threshold voltage has been found uniformly distributed over the entire sustrate surface. The liquid crystal molecular pretilt angle has also been found highly uniformly distributed at 35°.

EXAMPLE 7

Substrate 10
  A glass substrate 12 cm long and 24 cm wide with an ITO-made clear electrode provided on its surface.
Linear Evaporation Source 20
  Evaporation Depositing Material: SiO Vessel: A tantalum container 15 mm deep with its opening 26 cm long and 1.5 mm wide Control Member 30

A control member 9.8 cm wide having linear opening 31 made 26 cm long

The above substrate 10, linear evaporation source 20, and control member 30 have been laid out similarly to those for Example 3, and in accordance with the below listed evaporation depositing conditions, an alignment layer has been formed on the substrate surface by a slanted vacuum evaporation depositing process.

Angle $\theta_1$: 30°
Angle $\theta_2$: 35°
Evaporation Depositing Directional Angle $\theta$: 45°
Spacing D between Linear Evaporation Source 10 and Linear Opening 31: 60 cm
Substrate 10 Slide-Shifting Direction:
Vertical to linear opening 31 (similarly to Example 3)
Substrate 10 Slide-Shifting Speed: 5.9 cm/min
Layer Forming Speed: 10Å/sec
Substrate Temperture: Room temperature
Vacuum Level: $3.5 \times 1^{-6}$ torr The alignment layer formed under the above conditions has been uniform in both layer thickness and layer growth direction.

Two substrates each with the above alignment layer formed thereon have then been combined together to build a liquid crystal display device, and upon running drive tests thereon, the threshold voltage has been found uniformly distributed over the entire substrate surface. Upon measuring the liquid crystal molecular pretilt angle, it has been found at 0° over the entire substrate surface at high uniformity.

COMPARATIVE EXAMPLE 2

An alignment layer has been formed by a process similar to that employed for Example 3, except replacing the linear evaporation source with a point evaporation source, using no control member, and fixing the substrate in position.

Two substrates each with the above alignment layer formed thereon have then been combined together to build a liquid crystal display device, and upon running drive tests thereon, the threshold voltage dispersions across the entire substrate surface have been revealed at 6% or greater.

COMPARATIVE EXAMPLE 3

Figure 18A:
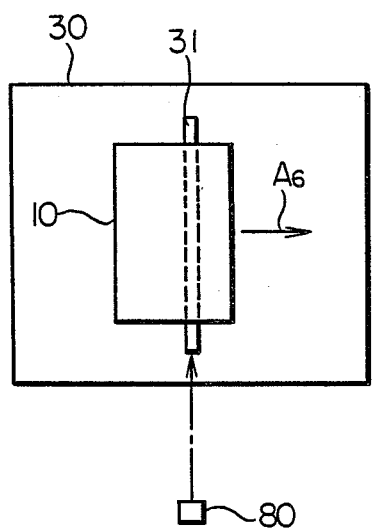
Figure 18B:
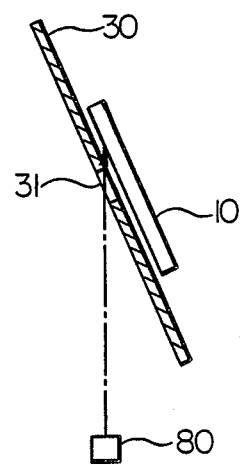

An alignment layer has been formed by a process similar to that employed for Example 3, except replacing the linear evaporation source with a point evaporation source, laying substrate 10, control member 30, and point evaporation source 80 as shown in FIGS. 18 (A) and 18 (B) instead, and slide-shifting substrate 10 in the arrow mark A6-indicated direction instead.

Two substrates each with the above alignment layer formed thereon have then been combined together to build a liquid crystal display device, and upon running drive tests thereon, the threshold voltage dispersions across the entire substrate surface have been revealed at 3% or greater.

COMPARATIVE EXAMPLE 4

An alignment layer has been formed by a process similar to that employed for Example 3, except using no control member and fixing the substrate in position.

Two substrates each with the above alignment layer formed thereon have then been combined together, and upon running drive tests thereon, the threshold voltage dispersions across the entire substrate surface have been revealed at 3% greater.

What is claimed is:

1. A substrate including an alignment layer useful in a liquid crystal display device fabricated by the steps of:
    disposing a linear source in a vacuum chamber, said linear source having a linear dimension and a center point substantially half-way along said linear dimension;
    disposing at least one substrate having a centerline, a center and a first surface in said vacuum chamber in fixed space relation to said linear source so that said first surface faces and a centerline of the substrate and the linear source are coplanar with said linear source and said center of said substrate lies substantially along a line through said center of said linear source and perpendicular to said linear source, said substrate being rotated about said centerline to a desired angle $\theta$, and the linear dimension of said linear source and a linear dimesion of said substrate projected onto said linear source being substantially equal;
    depositing material from said linear source onto said substrate.

2. A substrate made by the process recited in claim 1, wherein said step of depositing material from said linear source onto said substrate includes the steps of:
    drawing a vacuum in said vacuum chamber; and
    generating a flow of particles from said linear source.

3. A substrate made by the process recited in claim 1, wherein said step of disposing at least one substrate in fixed spaced relation to said linear source includes the step of disposing a plurality of substrates in fixed spaced relation to said linear source.

4. A substrate made by the process recited in claim 1, wherein the step of heating said linear source to vaporize material from said linear source includes the step of heating said linear source to vaporize material from said linear source to form a vapor until said vapor is deposited upon said substrate to form a deposition layer of a thickness on the order of 100 to 2500 Angstroms.

5. A substrate made by the process recited in claim 1, wherein said linear source is selected from the group including SiO, MgO, MgF$_2$, imide type polymers and amide type polymers.

6. A substrate including an alignment layer useful in a liquid crystal display device, the alignment layer being made by a process comprising:
    disposing a linear source in a vacuum chamber, said linear source having a linear dimension and a center point substantially half-way along said linear dimension;
    disposing a control member having at least one linear opening having a center point parallel to the linear source so that a line connecting the center of the linear source and the center of the opening is perpendicular to the linear source;
    disposing at least one substrate having a centerline, a center and a first surface in said vacuum chamber in fixed spaced relation to said linear source and said opening, said opening being disposed between the substrate and the linear source;
    moving the substrate relative to both the linear source and control member, keeping the substrate parallel to the linear source and establishing a desired angle $\theta$ between a line connecting the center of the linear source to the center of the opening and the first surface of the substrate;

depositing material from said linear source onto said substrate.

7. A substrate made by the process recited in claim 6, wherein said step of depositing material from said linear source onto said substrate includes the steps of:

drawing a vacuum in said vacuum chamber; and generating a flow of particles from said linear source.

8. A substrate made by the process recited in claim 6, wherein said step of disposing at least one substrate in fixed spaced relation to said linear source includes the step of disposing a plurality of substrates in fixed spaced relation to said linear source, said control member having a plurality of openings.

9. A substrate made by the process recited in claim 6, further comprising a step of heating said linear source to vaporize material from said linear source including the step of heating said linear source to vaporize material from said linear source to form a vapor until said vapor is deposited upon said substrate to form a deposition layer of a thickness on the order of 100 to 2500 Angstroms.

10. A substrate made by the process recited in claim 6, wherein said linear source is selected from a group including SiO, MgO, MgF$_2$, imide-type polymers and amide-type polymers.

11. A substrate made by the process recited in claim 6, wherein said control member includes at least one directional control plate.

12. A substrate made by the process recited in claim 11, wherein said directional control plate is oriented vertically relative to said linear opening.

13. A method for fabricating an alignment layer on a substrate useful in a liquid crystal display device, the method comprising:

disposing a linear source in a vacuum chamber, said linear source having a linear dimension and a center point substantially half-way along said linear dimension;

disposing at least one substrate having a centerline, a center and a first surface in said vacuum chamber in fixed spaced relation to said linear source so that said first surface faces and a center line of the substrate and the linear source are co-planar with said linear source and said center of said substrate lies substantially along a line through said center of said linear source and perpendicular to said linear source, said substrate being rotated about said centerline to a desired angle $\theta$, and the linear dimension of said linear source and a linear dimension of said substrate projected onto said linear source being substantially equal;

depositing material from said linear source onto said substrate.

14. A method as claimed in claim 13, wherein said step of depositing material from said linear source onto said substrate includes the steps of:

drawing a vacuum in said vacuum chamber; and generating a flow of particles from said linear source.

15. A method as claimed in claim 13, wherein said step of disposing at least one substrate in fixed spaced relation to said linear source includes the step of disposing a plurality of substrates in fixed space relation to said linear source.

16. A method as claimed in claim 13, wherein said step of disposing at least one substrate in said vacuum chamber includes the step of disposing at least one substrate in said vacuum chamber wherein said substrate has a linear dimension projected on said linear source on the order of 0.8 to 1.2 times the linear dimension of said linear source.

17. A method as claimed in claim 13, wherein said step of disposing at least one substrate in said vacuum chamber includes the step of disposing said substrate at a distance from said centerline of said linear source on the order of 2 to 6 times the linear dimension of said of said substrate projected onto said linear source.

18. A method as claimed in claim 13, wherein the step of disposing a linear source in a vacuum chamber includes the step of disposing an intermittent linear source.

19. A method as claimed in claim 13, further comprising a step of heating said linear source to vaporize material from said linear source including the step of heating said linear source to vaporize material from said linear source to form a vapor until said vapor is deposited upon said substrate to form a deposition layer of a thickness on the order of 100 to 2500 Angstroms.

20. A method as claimed in claim 13, further including the step of disposing a control member having a linear opening between said linear source and said substrate, said linear opening allowing the passage of vapor from said linear source.

21. A method as claimed in claim 20, wherein said linear source and said linear opening are disposed substantially parallel to each other.

22. A method as claimed in claim 13, wherein said linear source is selected from the group including SiO, MgO, MgF$_2$, imide type polymers and amide type polymers.

23. A method as claimed in claim 13, wherein said desired angle is in the range of 1 to 50 degrees.

24. A method as claimed in claim 23, wherein said desired angle is in the range of 5 to 15 degrees.

25. A method as claimed in claim 23, wherein said desired angle is in the range of 25 to 45 degrees.

26. A method for fabricating an alignment layer on a substrate useful in a liquid crystal display device, the method comprising:

disposing a linear source in a vacuum chamber, said linear source having a linear dimension and a center point substantially half-way along said linear dimension;

disposing a control member having at least one linear opening having a center point parallel to the linear source so that a line connecting the center of the linear source and the center of the opening is perpendicular to the linear source;

disposing at least one substrate having a centerline, a center and a first surface in said vacuum chamber in fixed spaced relation to said linear source and said opening, said opening being disposed between the substrate and the linear source;

moving the substrate relative to both the linear source and the control member, keeping the substrate parallel to the linear source and establishing a desired angle $\theta$ between a line connecting the center of the linear source to the center of the opening and the first surface of the substrate;

depositing material from said linear source onto said substrate.

27. A method as claimed in claim 26, wherein said step of disposing at least one substrate in fixed relation to said linear source includes the step of disposing a plurality of substrates in fixed spaced relation to said linear source, said control member including a plurality of openings.

28. A method as claimed in claim 26, wherein said control member includes at least one directional control plate.

29. A method as claimed in claim 28, wherein said directional control plate is oriented vertically relative to said linear opening.

30. A method as claimed in claim 26, wherein said step of depositing material from said linear source onto said substrate includes the steps of:
drawing a vacuum in said vacuum chamber; and
generating a flow of particles from said linear source.

31. A method as claimed in claim 26, wherein said step of disposing at least one substrate in said vacuum chamber includes the step of disposing at least one substrate in said vacuum chamber wherein said substrate has a linear dimension projected on said linear source on the order of 0.8 to 1.2 times the linear dimension of said linear source.

32. A method as claimed in claim 26, wherein said step of disposing at least one substrate in said vacuum chamber includes the step of disposing said substrate at a distance from said centerline of said linear source on the order of 2 to 6 times the linear dimension of said substrate projected onto said linear source.

33. A method as claimed in claim 26, wherein the step of disposing a linear source in a vacuum chamber includes the step of disposing an intermittent linear source.

34. A method as claimed in claim 26, wherein the step of heating said linear source to vaporize material from said linear source includes the step of heating said linear source to vaporize material from said linear source to form a vapor until said vapor is deposited upon said substrate to form a deposition layer of a thickness on the order of 100 to 2500 Angstroms.

35. A method as claimed in claim 26, wherein said linear source is selected from the group including SiO, MgO, MgF$_2$, imide type polymers and amide type polymers.

36. A method as claimed in claim 26, wherein said desired angle is in the range of 1 to 50 degrees.

37. A method as claimed in claim 36, wherein said desired angle is in the range of 5 to 15 degrees.

38. A method as claimed in claim 36, wherein said desired angle is in the range of 25 to 45 degrees.

39. An apparatus for fabricating an alignment layer on a substrate useful in a liquid crystal display device, the apparatus comprising:
linear source holding means for holding a linear source in a vacuum chamber, said linear source having a linear dimension and a centerpoint substantially half-way along its linear dimension;
substrate holding means for holding at least one substrate in said vacuum chamber in fixed spaced relation to said linear source, said substrate having a center line, a center and a first surface, said substrate holding means holding said substrate so that said first surface faces and a centerline of the substrate and the linear source are co-planar with said linear source and said center of said substrate lies along a line through said center of said linear source and perpendicular to said linear source, the linear dimension of said linear source and a linear dimension of said substrate projected onto said linear source being substantially equal, and said substrate being rotated about said center line to a desired angle $\theta$;
means for drawing a vacuum in said vacuum chamber; and
means for generating a flow of particles from said linear source.

40. An apparatus as claimed in claim 39, wherein said substrate holding means includes means to hold a plurality of substrates.

41. An apparatus as claimed in claim 39, wherein said substrate has a maximum linear dimension projected on said linear surface on the order of 0.8 to 1.2 times the linear dimension of said linear source.

42. An apparatus as claimed in claim 39, wherein the distance between said linear source and said substrate at said centerline is on the order of 2 to 6 times the linear dimension said substrate projected onto said linear source.

43. An apparatus as claimed in claim 39, wherein said linear source is an intermittent linear source.

44. An apparatus as claimed in claim 39, wherein said linear source is heated to form a vapor and said vapor is deposited on said substrate to form a deposition layer of a thickness on the order of 100 to 2500 Angstroms.

45. An apparatus as claimed in claim 39, further including a control member having a linear opening disposed between said linear source and said substrate, said linear opening allowing the passage of vapor from said linear source.

46. An apparatus as claimed in claim 45, wherein said linear source and said linear opening are disposed substantially parallel to each other.

47. An apparatus as claimed in claim 39, wherein said linear source is selected from the group including SiO, MgO, MgF$_2$, imide type polymers and amide type polymers.

48. An apparatus as claimed in claim 39, wherein said desired angle is in the range of 1 to 50 degrees.

49. An apparatus as claimed in claim 48, wherein said desired angle is in the range of 5 to 15 degrees.

50. An apparatus as claimed in claim 48, wherein said desired angle is in the range of 25 to 45 degrees.

51. An apparatus for fabricating an alignment layer on a substrate useful in a liquid crystal display device, the apparatus comprising:
a linear source disposed in a vacuum chamber having a linear dimension and a center point substantially half-way along said linear dimension;
a control member having at least one linear opening having a center point parallel to the linear source so that a line connecting the center of the linear source and the center of the opening is perpendicular to the linear source;
holding means for holding at least one substrate having a centerline, a center and a first surface in said vacuum chamber in fixed spaced relation to said linear source and said opening, said opening being disposed between the substrate and the linear source;
moving means for moving the holding means and the substrate relative to both the linear source and the control member, keeping the substrate parallel to the linear source and establishing a desired angle $\theta$ between a line connecting the center of the linear source to the center of the opening and the first surface of the substrate.
means for drawing a vacuum in said vacuum chamber, and means for generating a flow of particles from said linear source.

52. An apparatus as claimed in claim 51, wherein said control member has at least one directional control plate.

53. An apparatus as claimed in claim 52, wherein said directional control plate is oriented vertically relative to said opening.

54. An apparatus as claimed in claim 51, wherein said substrate holding means includes means to hold a plurality of substrates, said control member having a plurality of openings.

55. An apparatus as claimed in claim 51, wherein said substrate has a maximum linear dimension projected on said linear surface on the order of 0.8 to 1.2 times the linear dimension of said linear source.

56. An apparatus as claimed in claim 51, wherein the distance between said linear source and said substrate at said centerline is on the order of 2 to 6 times the linear dimension said substrate projected onto said linear source.

57. An apparatus as claimed in claim 51, wherein said linear source is an intermittent linear source.

58. An apparatus as claimed in claim 51, wherein said linear source is selected from the group including SiO, MgO, $MgF_2$, imide type polymers and amide type polymers.

59. An apparatus as claimed in claim 51, wherein said desired angle is in the range of 1 to 50 degrees.

60. An apparatus as claimed in claim 59, wherein said desired angle is in the range of 5 to 15 degrees.

61. An apparatus as claimed in claim 59, wherein said desired angle is in the range of 25 to 45 degrees.

* * * * *

UNITED STATES PATENT AND TRADEMARK OFFICE
CERTIFICATE OF CORRECTION

PATENT NO. : 4,897,290
DATED : January 30, 1990
INVENTOR(S) : Toru Terasaka, et al.

Page 1 of 11

It is certified that error appears in the above-indentified patent and that said Letters Patent is hereby corrected as shown below:

Columns 1-20 should be deleted to appear as per attached columns 1-20.

Signed and Sealed this

Ninth Day of August, 1994

Attest:

BRUCE LEHMAN

Attesting Officer

Commissioner of Patents and Trademarks

METHOD FOR MANUFACTURING THE SUBSTRATE FOR LIQUID CRYSTAL DISPLAY

This application is a continuation of application Ser. No. 101,665, filed Sep. 28, 1987, now abandoned.

FIELD OF THE INVENTION

This invention relates to a method for the manufacture of a substrate suitable for liquid crystal display devices.

BACKGROUND OF THE INVENTION

Liquid crystal display devices, by virtue of their low power consumption, low production costs, light weight and low profile feasibilities, ready color display capabilities, and other advantageous features, have come to be employed for the increasingly further diversified applications of late.

The liquid crystal display device is usually configured of a pair of substrates each having an electrode layer and alignment layer, and a liquid crystal substrate sandwiched and sealed therebetween.

Known alignment layer forming methods include the vacuum evaporation depositing process, rubbing process, and various other techniques, of which the vacuum evaporation depositing process serves particularly advantageously to form the super-twisted type of liquid crystal display devices having a large liquid crystal molecular twist angle ranging from 180° to 360° (Japanese Patent O.P.I. Publications Nos. 107020/1985 and 203921/1985) for example, by virtue of a relatively large pretilt angle (formed by the direction of liquid crystal molecular directors in contact with the alignment layer surface of a substrate and the substrate surface) that the process provides.

Conventionally, the following vacuum evaporation depositing methods have been known to be employed for forming the alignment layer of liquid crystal display devices:

(1) A method that uses a point source for the evaporation source (2) A method that applies an iris-controlled vapor particulate beam to the substrate being slide-shifted in the process in a vertical attitude to the evaporation depositing direction (Japanese Patent O.P.I. Publications Nos. 5232/1986 and 24864/1979).

(3) A method that, by using a specifically formed slit through which to transmit depositing vapor particles, vertically slide-shifts the substrate in a warped posture (Japanese Patent O.P.I. Publication No. 5232/1986).

By method (1) above, however, the closer to the end of a substrate, the greater will deviations be between the actual depositing direction and an anticipated one, although in a central area of the substrate, such deviations may be minimized and high accuracy depositions made in the anticipated direction. Accordingly, the resultant alignment angle of a liquid crystal display device will vary, depending on the local substrate area, and in consequence, the contrast ratio, threshold voltage, and other substrate parameters will be disuniformized, raising a problem of degraded display capabilities.

By method (2) above, as described in Japanese Patent O.P.I. Publication No. 5232/1986, since the substrate is slide-shifted in a vertical attitude to the evaporation depositing direction, the evaporation depositing directional angle may be uniformized but the evaporation depositing angle and layer thickness will tend to be disuniformized, raising a problem of as yet insufficient display capabilities.

By method (3) above, as described in Japanese Patent O.P.I. Publication No. 5232/1986, since a specifically formed slit is employed and the substrate slide-shifted vertically to the evaporation depositing direction in a warped posture, an alignment layer may be formed with its evaporation depositing directional angle, evaporation depositing angle, and layer thickness all duly uniformized, but on the other side of the coin, the method requires manufacturing equipment of considerable complexity for its implementation, raising a problem in the difficulty of its commercialization.

SUMMARY OF THE INVENTION

This invention has been completed by the situation described above, and, thus the object of the invention is to provide a method of manufacturing a substrate advantageously applicable to liquid crystal display devices and capable of producing liquid crystal display devices that are uniform in the alignment angle distribution through a simple process requiring less complex equipment.

Directed toward the manufacture of liquid crystal display devices including the formation of an alignment layer on the substrate by a vacuum deposition process, the method of the present invention is characterized by employing a linear evaporation source that meets requirement (1) described below, and arranging the substrate in a manner that meets requirement (2) described below, to form an alignment layer on said substrate by a vacuum deposition process.

Requirement (1)

The linear deposition source employed has a length which at least corresponds to that of the substrate in a direction in which the uniform deposition is required.

Requirement (2)

The substrate is placed opposite to and within the length of the linear deposition source and the vacuum deposition is effected by an oblique vacuum deposition process, in which said substrate is placed so that the angle formed by the direction of a source material flown at the right angle from the linear deposition source and the plane of the substrate is not a right angle.

BRIEF DESCRIPTION OF THE DRAWINGS

FIGS. 1 and 2 are the front and longitudinally cross-sectional views respectively outlining an example embodiment of this invention shown for explanatory purposes, FIGS. 3 through 5 views outlining other example embodiments of this invention for explanatory purposes, FIG. 6 a cross-sectional view of the liquid crystal display device showing its structure for explanatory purposes, and FIGS. 7 and 8 the front and side views respectively outlining a specific example embodiment of this invention shown for explanatory purposes.

FIGS. 9 through 11 are the front, side, and plan views respectively that outline one of preferable embodiment of the present invention, and FIG. 12 is an explanatory drawing showing interrelations of the linear opening and evaporation depositing angle $\theta$ of a control member, while FIGS. 13 through 15 show other preferable embodiments of the present invention. FIG. 16 (A) and 16 (B) are the plan and front views respectively of one of preferable embodiment of the present invention and FIG. 17 (A) and 17 (B) the plan and front views respectively of another embodiment while FIG. 18 (A) and 18

(B) are the plan and front views respectively of a comparative example. FIG. 19 (A) and 19 (B) are the cross-sectional and slanted views respectively of another structural example of the linear evaporation source, and FIG. 20 the slanted view of a directional control plate.

| 10 | Substrate | 20 | Linear Evaporation Source |
|---|---|---|---|
| 11 | Center of Substrate Center Line | 21 | Center of Linear Evaporation Source |
| 30 | Control Member | 31 | Linear Opening |
| 32 | Center | 33 | Edge of the Opening |
| 34 | Edge of the Opening | | |
| L | Substrate Center Line | D | Evaporation Depositing Direction |
| φ | Angle of Evaporation Depositing Direction | θ | Evaporation Depositing Angle |
| 41 | Upper Substrate | 51 | Lower Substrate |
| 42,52 | Support Plates | 43,53 | Electrode Layers |
| 44,54 | Alignment Layers | 63 | Liquid Crystal Layer |
| 71 | Front Polarization Element | 72 | Rear Polarization Element |
| 73 | Reflective Plate | | |
| 80 | Point Evaporation Source | | |

DETAILED DESCRIPTION OF THE INVENTION

According to the method of the present invention, not only is the length of a linear evaporation source employed made to correspond to the substrate length in a direction in which the uniform deposition on the said substrate surface will be required (requirement (1)), but the substrate center line in a direction in which the uniform evaporation depositing on the substrate surface will be required, the evaporating direction of the linear evaporation source, and the linear evaporation source itself are also laid out roughly to belong on one and the same plane, and in addition, said substrate is positionally fixed relative to said evaporation source in a manner for said evaporating direction and said evaporation source to intersect each other at approximately right angles (requirement (2)), to have an alignment layer formed by a vacuum evaporation deposition process, so that despite the simplicity of the method, an alignment layer having uniform alignment angles at high precision in the direction in which the uniform evaporation depositing on the substrate surface will be required may be formed, and in consequence, liquid crystal display devices uniform in contrast ratio, threshold voltage, and other parameters manufactured.

This invention is next described specifically below. FIGS. 1 and 2 are the front and A—A cross-sectional views respectively that schematically illustrate the method of this invention.

In these figures, 10 indicates a substrate, 20 a linear evaporation source, L an imaginary center line in a direction in which the uniform deposition is required, and D the flow direction from the linear evaporation source. Symbol $\phi$ indicates an evaporating direction angle, that is, the angle formed by substrate center line L and evaporating direction D. Symbol $\theta$ indicates an evaporation depositing angle, that is, the angle formed by evaporating direction D and its projected component on the substrate surface, at center 11 of substrate center line L.

Under this invention, linear evaporation source 20 that meets requirement (1) described below is employed, and by laying substrate 10 out relative to said linear evaporation source 20 in a manner that meets requirement (2) described below, an alignment layer will be formed on said substrate by a vacuum evaporating depositing process.

Requirement (1)

The length of linear evaporation source 20 shall correspond to length S of substrate 10 in a direction in which the uniform evaporation depositing on the said substrate 30 surface will be required.

Requirement (2)

Center Line L of a substrate in a direction in which the uniform evaporation depositing on the substrate surface will be required, evaporating direction D of linear evaporation source 20, and said linear evaporation source 20 shall roughly be laid out to belong on one and the same plane, and said substrate 10 shall positionally be fixed relative to said linear evaporation source 20 in a manner for said evaporating direction D and said linear evaporation source 20 to intersect each other at approximately right angles.

In the above description, the length of linear evaporation source 20 corresponds to length S of substrate 10, but the two need not precisely coincide with each other, and the former needs only to be a length equaling 80 to 120% of said length S. Specifically, the length should preferably be set to hold deviations between the actually evaporation deposited directional angle and an anticipated evaporation depositing directional angle within a commercially tolerable range.

The substrate 10 is preferably positioned in a manner to have center 11 of its center line L located on an extension of evaporating depositing direction D that passes through center 21 of linear evaporation source 20. By laying the substrate out at such a preferred position, the length required of linear evaporation source 80 can be shortened, permitting alignment layers to be produced at lower cost.

Evaporation deposition directional angle $\phi$ and evaporation deposition angle $\theta$ are not particularly limited, but may appropriately be selected on the basis, for example, of required parameters of the liquid crystal display device.

Actually, evaporation deposition directional angle $\phi$ is selected to have the optimum visibility direction of the liquid crystal display devices to be manufactured coincide with their reference view angle direction, and is, for example, preferably set in the vicinity of 45° in the case of a 90° twisted nematic type or a 270° super-twisted type of liquid crystal display devices.

Meanwhile, evaporation deposition angle $\theta$ is set on the basis of the magnitude of a required pretilt angle. In the case of a super-twisted type of liquid crystal display devices of which a large pretilt angle is required, for example, an angle ranging from 5° to 15° will be suitable, while in the case of liquid crystal display devices of which only a small pretilt angle is required, an angle ranging from 25° to 45° will be appropriate.

The thickness of alignment layers, may range from 300Å to 2,500Å at center 11 of substrate 10 and 500Å to 1,200Å is more preferable. An insufficient thickness of alignment layers provides lower liquid crystal aligning power, which gives rise to the generation of uneven alignments. An excessive thickness of alignment layers, on the other hand, attenuates liquid crystal driving voltages, and may degrade the voltage versus optical variation characteristics or response characteristics of resultant liquid crystal display devices.

The longer the distance H from linear evaporation source 20 to center 11 of substrate center line L of substrate 10, the higher will the accuracy be at which evaporation depositing angle $\theta$ may be uniformized over the entire surface of substrate 10, and in practice, a distance two to six times as long as the substrate 10 length in evaporation depositing direction D is sufficient.

The specific structure of linear evaporation source 20 is not particularly restricted, but may be formed, for example, with an elongated evaporation source vessel and orifices opening into the vessel. For physical configurations of the orifices, a slit, the row of tiny holes laid out in a straight line, or similar other configurations may be employed. When arranging tiny holes in a row, the hole spacing should preferably be 1/10 or less of evaporation depositing distance H.

As for the evaporation source vessel material, no particular limitations are imposed, and, for example tantalum, molibdenum, tungsten, or the like may be employed.

As another alternative, a linear evaporation source with deposition vapor control members consolidated together with the vessel may also be employed. Specifically, as shown in FIGS. 19 (A) and 19 (B), linear opening 26 may be provided to extend longitudinally along the wall of a long tubular evaporation, source vessel 25, and deposition vapor flow control members 27 consisting of a pair of plates projecting from the tubular wall area that forms said opening 26 may additionally be provided, together to configure linear evaporation source 20. Thus, the deposition vapor flow may also be regulated in a predesignated direction by employing linear evaporation source 20 for which deposition vapor flow control members 27 have been consolidated with evaporation source vessel 25 to form a one-piece unit.

Regarding the evaporation depositing material, no particular restrictions are imposed, and actually SiO, MgO, MF$_2$, or equivalent, or even an organic material composed of imide type or amide type polymers may for example be employed.

With regard to the material of substrates 10, no particular restrictions are levied either, and glass, plastic resins, etc. may be employed. In addition, an evaporation depositing area regulating mask may also be provided on top of substrate 10.

FIGS. 3 and 4 each schematically illustrate other embodiment of the present invention. In FIG. 3, substrate 10 is positioned below linear evaporation source 20 at an angle, for the formation of an alignment layer. In FIG. 4, substrate 10 is positioned above linear evaporation source 20 at an angle, for the formation of an alignment layer. In these examples, evaporation depositing direction D is at an angle. Under this invention, substrate 30 may thus be positioned either above or below linear evaporation source 80, whichever preferred.

FIG. 5 shows still another embodiment of the present invention. In this example, multiple substrates 10 have been laid out above a linear evaporation source that serve them all in common, and an alignment layer formed simultaneously on each of the multiple substrates 10. Here, linear evaporation source 20 that meets said requirement (1) against each and every one of the multiple substrates 10 that in turn have been laid out and fastened down in a manner to individually meet said requirement (2) against the common linear evaporation source 20. Such an alignment layer formin process applied simultaneously to multiple substrates 10, with linear evaporation source 20 serving them all in common, significantly enhances the production efficiency FIG. 6 shows the specific structure of an exampl liquid crystal display device built with component de vices having a substrate with its alignment layer formed by the process described above, presented fo explanatory purposes. In this example liquid crysta display device, upper substrate 41 and lower substrat 51 have been spaced apart from each other, wher upper substrate 41 consists of electrode layer 43 pro vided on the inner surface of support plate 42 and align ment layer 44 formed in conformance with this inven tion, and lower substrate 51 consists of electrode layer 53 provided on the inner surface of support plate 52 and alignment layer 54 formed in conformance with this invention.

The space inbetween upper substrate 41 and lower substrate 51 has been sealed with sealer block 61, to configure a liquid crystal display device. Inside the liquid crystal display device, multiple spacers 62 have been laid out to be mutually spaced apart, and the remaining space filled with a liquid crystal material to form liquid crystal layer 63.

Over the outer surfaces of upper substrate 41 and lower substrate 51, front polarizing optical element 71 and rear polarizing optical element 72 have respectively been provided. Shown in the same cross-sectional view, 73 indicates a reflective plate provided to cover the outer surface of rear polarizing element 72. This reflective plate 73 is omitted in a transmitting type of liquid crystal display devices.

As the constituent material of support plates 42 and 52, soda-lime glass, borosilicate glass, quartz glass, or similar; plastic sheets made of uniaxially drawn polyethylene terephthalate, polyether sulphone, polyvynil alcohol, or equivalent; metallic sheets made of aluminum, stainless steel, or equivalent; or similar may be employed.

Electrode layers 43 and 53 consists of clear electrodes 45 and 55 made, for example, of 1000Å thick ITO (an oxide of tin and indium) provided over; and inparallel with but spaced apart from, support plates 42 and 52 made, for example, 1.1 mm thick, where clear electrode 45 constituting one of the electrode layers, 43, and clear electrode 55 constituting the other electrode layer, 53, have been laid out to be orthogonally oriented with each other, to form a matrix type of display electrodes consisting, for example, of 0.3 mm × 0.3 mm picture element electrodes.

Alignment layers 44 and 55 are formed by a manufacturing method under this invention out of SiO employed as the evaporation deposition material, at a 6° evaporation deposition angle for example, and made 800Å thick for example.

Upper substrate 41 and lower substrate 51 may additionally be provided with a dielectric layer, alkali ionic migration preventive layer, reflection preventive layer, polarization layer, reflective layer, and/or other layers, as required.

Front polarization element 71 consists for example of the "F-1205DU" (made by Nitto Denko), while rear polarization element 72 and reflective plate 73 both consist for example of the "F-3205M" (made by Nitto Denko).

Spacer 62 is made for example out of the "PF-60S" fiber glass (made by Nippon Electrical Glass), and sealer block 61 out of the "XN-5A-C" Structbond (made by Mitsui Toatsu Kagaku).

As the liquid crystal forming material to form said liquid crystal layer 63, any material conventionally employed for similar applications may be employed and no particular restrictions are levied thereon. Specifically, nematic liquid crystals, chiral-nematic liquid crystals, smectic liquid crystals, cholestric liquid crystal, chiral-smectic liquid crystals, or any other well-known liquid crystals, as well as any of their combinations, may be employed.

As for display modes, any of the twisted nematic (TN) type modes, guest host (GH) type modes, voltage-controlled (electrically controlled) birefringence (ECB) modes, cholestric-nematic type phase transition modes, dynamic scatter (DS) modes, and the like may be employed.

The present invention is further described below with reference to preferable embodiments.

FIGS. 9 through 11 are the explanatory views outlining preferable embodiment of the present invention, where FIG. 9 gives its view from the X axis direction, FIG. 10 that from the Y axis direction, and FIG. 11 that from the Z axis direction.

In these figures, 10 indicates a substrate, 20 a linear evaporation source, 30 a control member, 31 a linear opening for the passage of an evaporation deposition material, L the longitudinal center line of the substrate, and B the evaporation depositing direction. Symbol $\phi$ indicates the evaporation depositing directional angle, that is, an angle formed by substrate center line L and the projection on the substrate surface of evaporation depositing direction B, and $\theta$ the evaporation depositing angle, that is, an angle of intersection by evaporation depositing direction B with the surface of substrate 10.

In the illustrated example, the longitudinal orientation of linear evaporation source 20 has been made to coincide with the X axis, and center 21 of said linear evaporation source 20 positioned at the point of origin of the X axis. Control member 30 has been located inbetween substrate 10 and linear evaporation source 20, and positioned to make linear opening 31 of said control member 30 parallel with linear evaporation source 20, and to have center 32 of said linear opening 31 roughly belong on the YZ plane.

This invention stipulates linear evaporation source 20 and control member 30 to be arranged in the above described layout, and an alignment layer made of evaporation-deposited component layers to be formed, not only by having the deposition vapor from linear evaporation source 20 pass through linear opening 31 of control member 30, but also by having the deposition vapor flow hit the surface of said substrate 10 through slide-shifting substrate 10 in a manner to cut across the deposition vapor flow that has passed through said linear opening 31.

The slide-shifting direction of substrate 10 may be arbitrarily defined, as long as evaporation depositing directional angle $\phi$, evaporation depositing angle $\theta$, and spacing H between substrate 10 and linear opening 31 of control member 30 are held steady during the slide-shifting process. As indicated by arrow mark A1 in FIG. 11, substrate 10 is slide-shifted in the example under discussion with the long side of substrate 10 leading, and in a direction along its short side and parallel to the surface of control member 30.

As shown in the FIG. 12 enlarged view, such a slanted deposition process limits the flight direction of a deposition vapor flow passing through linear opening 31 within an angle ranging from $\theta 1$ to $\theta 2$ as regulated by one edge 33 and the other edge 34 which together form linear opening 31. Accordingly, when substrate 10 is slide-shifted in a direction indicated by arrow mark A2, for example, angle $\theta 2$ will regulate evaporation depositing angle $\theta$, and when it is slide-shifted in a direction indicated by arrow mark A3, angle $\theta 1$ will regulate evaporation depositing angle $\theta$.

Thus, by appropriately selecting the substrate 10 slide-shifting direction, evaporation depositing angle $\theta$ may be determined with either $\theta 1$ or $\theta 2$ whichever applicable. The magnitude of $\theta 1$ and $\theta 2$ may be determined by appropriately selecting width d of linear opening 31 of control member 30, and spacing D between said linear opening 31 and linear evaporation source 20.

The greater the spacing between substrate 10 and linear evaporation source 20, the more uniformly over an entire substrate surface may evaporation depositing directional angle $\phi$ be distributed, but in practice, as long as it is at least double the diagonal length of the substrate, the evaporation depositing direction may be distributed to be sufficiently uniform for commercial applications. On the other hand, to minimize the influence of heat from an evaporation source, the substrate to evaporation source spacing should preferably be made at least 30 cm.

Furthermore, directional control plates 40 may also be provided inbetween control member 30 and linear evaporation source 20 to directionally regulate the deposition vapor flow for even higher uniformity of the evaporation depositing directional angle. As shown in FIG. 20, directional control plates 40 should preferably be vertically oriented to linear opening 31 of control member 30.

The substrate 10 slide-shifting speed should be determined in view of width d of linear opening 31, the layer forming speed, and the alignment layer thickness. Where, for example, the deposition vapor flow is held steady in flow rate, a steady layer forming speed may be achieved by holding the slide-shifting speed steady, and where the deposition vapor flow fluctuates, the slide-shifting speed may be varied in accordance therewith to maintain the uniformity.

The length of linear opening 31 should be selected to permit the entire surface of substrate 10 to evenly pass directly above said linear opening 31. Specifically, it should be a length to expose the entire surface of substrate 10 to a deposition vapor flow, and should be determined in view of evaporation depositing directional angle $\phi$ and the slide-shifting direction of substrate 10. The size of control member 30 is only stipulated to be large enough to prevent the deposition vapor flow out of linear evaporation source 20 from reaching substrate 10 via any other path than through linear opening 31, and its physical configurations may be made planar or in any other form.

The length of linear evaporation source 20 should preferably equal that of linear opening 31 of control member 30, but roughly 80 to 120% of the diagonal length of substrate 10 will be sufficient. Specifically, the length should preferably be set to hold deviations between the actual evaporation depositing directional angle and an anticipated one within a commercially tolerable range.

Where spacing D between linear opening 31 of control member 30 and linear evaporation source 20 is long, the length of linear evaporation source 20 may be set to be relatively short, but where spacing D is short, the length of linear evaporation source 20 should at least equal that of linear opening 31.

In this case, too, no particular restrictions are imposed on evaporation deposition directional angle φ or evaporation deposition angle θ, but these parameters may appropriately be selected on the basis, for example, of the performance demanded of liquid crystal display devices. In other words, evaporation depositing directional angle φ is often selected to have the optimum visibility direction of end liquid crystal display devices coincide with a reference view angle direction. Evaporation depositing angle θ is set on the basis of the required pretilt angle magnitude, and is usually selected from a 1° to 50° range.

The substrate 10 material is not particularly restricted, and glass, a plastic resin, or equivalent may be employed therefor. A mask may also be provided over substrate 10 to the formation on the substrate 10 surface in advance will be required of either electrode layers for the liquid crystal drive or drive devices.

No vertical interrelations are paticularly imposed among substrate 10, linear evaporation source 20, and control member 30. As shown in FIGS. 13 and 14, linear evaporation source 20 may for example be positioned above substrate 10 and control member 30, at a slanting angle.

As shown in FIG. 15, another alternative is to provide ringlike control members 30 surrounding a single linear evaporation source 20, to equip them with multiple linear openings 31, and by using the same number of substrates 10 as these linear openings 31, to have alignment layers formed on these substrates 10 simultaneously.

Under this invention, a pair of substrates each with an alignment layer formed thereon by the process described above is used to build a liquid crystal display device. No particularly restricted structure is imposed on liquid crystal display devices for which a variety of configurations may be employed, nor is the liquid crystal particularly limited, permitting the use of a variety of liquid crystal types.

Now, actual embodiment examples of this invention are described below, but in no way will applications of this invention be limited by such example embodiments.

EXAMPLE 1

As shown in FIGS. 7 and 8, a glass substrate (12 cm long and 24 cm wide) has been employed for substrate 30 with surface 32 covered by a patterned electrode layer (not illustrated), and a linear evaporation source (with its orifice opening 26 cm long and 1.5 mm wide, and a vessel 5 mm deep) having a length that corresponds to length S of said substrate 30 in the direction (arrow A) in which the uniform evaporation depositing on the said substrate 30 surface will be required, for linear evaporation source 80. Said substrate 30 has then been positionally fixed above linear evaporation source 80 in an attitude to have substrate center line L in the direction in which the uniform evaporation depositing on the substrate 30 will be required, evaporation depositing direction D of linear evaporation source 80, and evaporation source 80 itself belong roughly on one and the same plane, and to have evaporation depositing direction D and linear evaporation source 80 intersect each other at approximately right angles.

Evaporation depositing directional angle φ has been made 45° against substrate center line L, and evaporation depositing angle θ, or the angle formed at center 31 of substrate center line L by evaporation depositing direction D and its component projected on the substrate surface, made 6°. In addition, substrate 30 has also been arranged to have center 31 of its center line L positioned on an extension of evaporation depositing direction D at center 81 of linear evaporation source 80.

It was with substrate 30 and linear evaporation source 80 thus laid out that an alignment layer has been formed on surface 32 of substrate 30 by a vacuum evaporation depositing process.

Conditions employed for the vacuum evaporation depositing process have been as follows:
Evaporation Depositing Material: SiO
Substrate 30 Temperature: Room temperature
Vacuum Level: $3.5 \times 10^{-6}$ torr
Distance H from Linear Evaporation Source 80 to Center 31 of Substrate 30: 70 cm
Evaporation Depositing Speed: 5Å/sec Two substrates with an alignment layer formed by the above process have been used, one for the upper substrate and the other for the lower, and a liquid crystal display device similarly structured to the one shown in FIG. 6 built. This device will hereinafter be referred to as "liquid crystal display device A".

For the liquid crystal forming substance to constitute liquid crystal layer C, the "ZLI-2293" nematic liquid crystal material (made by Merck) with the "S-811" optical rotator (made by Merck) added on has been employed.

Liquid crystal display device A has then been driven by a multiplex drive system at a 1/100 duty rate, to measure the contrast ratio (ratio of the luminance of reflected rays in a select (dark) mode to that in a non-select (light) mode) and threshold voltage at various locations on the device. The measurements taken have revealed 1% or less dispersions along substrate center line L of the liquid crystal display surface, testifying to a high level of uniformity achieved.

EXAMPLE 2

Alignment layers have been formed on substrates by the same process as for Example 1 except altering evaporation depositing directional angle φ to 90° and evaporation depositing angle θ to 10°, and a liquid crystal display device built with thus prepared substrates in a manner similar to Example 1. This device will hereinafter be referred to as "liquid crystal display device B".

Liquid crystal display device B has then been driven and measured as to the contrast ratio and threshold voltage at various locations of its display surface, in a similar manner to Example 1. The measurements taken have revealed hardly any dispersions along substrate center line L of the liquid crystal display surface, testifying to a high level of uniformity achieved.

COMPARATIVE EXAMPLE 1

Alignment layers have been formed on substrates 30 by a process similar to that employed for Example 1 except the use of a point evaporation source in lieu of linear evaporation source 80. The point evaporation source has been positioned directly below center 31 of substrate center line L of substrate 30.

Then by using two substrates each with an alignment layer formed by the process described above, a liquid crystal display device has been built similarly to Example 1. This device will hereinafter be referred to "contrasting liquid crystal display device 'a'".

Comparative liquid crystal device 'a' has then been driven and measured as to the contrast ratio and threshold voltage at various locations of its display surface, in a manner similar to Example 1. The measurements taken have revealed 6% or greater dispersions along substrate center line L of the liquid crystal display surface, with the dispersions in contrast ratio and threshold voltage made increasingly greater along with the distance away from center 31 of substrate center line L, and have shown the device to be inferior in the uniformity of its local parameters.

EXAMPLE 3

Substrate 10
A glass substrate 12 cm long and 24 cm wide, with an ITO-made clear electrode provided on its surface
Linear Evaporation Source 20
Evaporation Depositing Material: SiO
Vessel: A tantalum container 15 mm deep with its opening 26 cm long and 1.5 mm wide
Control Member 30
A control member 40 cm wide having linear opening 31 made 26 cm long The above substrate 10, linear evaporation source 20, and control member 30 have been laid out as shown in FIGS. 16 (A) and 16 (B), and in accordance with the below listed evaporation depositing conditions, an alignment layer formed on the substrate surface by a slanted vacuum evaporation depositing process.

Angle $\theta1$: 7°
Angle $\theta2$: 7.5°
Evaporation Depositing Directional Angle $\phi$: 45°
Spacing D between Linear Evaporation Source 20 and Linear Opening 31: 60 cm
Substrate 10 Slide-Shifting Direction: Vertical to linear opening 31 (Arrow A4 Direction)
Substrate 10 Slide-Shifting Speed: 2.5 cm/min
Layer Forming Speed: 10Å/sec
Substrate Temperature: Room temperature
Vacuum Level: $3.5 \times 10^{-6}$ torr The alignment layer formed under the above conditions has been uniform in layer thickness and layer growth direction.

Two substrates with the above alignment layer formed thereon have then been combined together to build a liquid crystal display device, and upon running drive tests thereon, the threshold voltage has been found uniformly distributed over the entire substrate surface. Upon measuring the pretilt angle of liquid crystal molecules, it has been found to be at 33° and highly uniformly distributed.

EXAMPLE 4

Substrate 10
A glass substrate 12 cm long and 24 cm wide, with an ITO-made clear electrode provided on its surface
Linear Evaporation Source 20
Evaporation Depositing Material: SiO
Vessel: A tantalum container 15 mm deep with its opening 26 cm long and 1.5 mm wide
Control Member 30
A control member 40 cm wide having linear opening 30 made 26 cm long The above substrate 10, linear evaporation source 20, and control member 30 have been laid out as shown in FIGS. 17 (A) and 17 (B), and in accordance with the below listed evaporation depositing conditions, an alignment layer formed in a similar manner to Example 1.

Angle $\theta1$: 5°
Angle $\theta2$: 10°
Evaporation Depositing Directional Angle $\phi$: 45°
Spacing D between Linear Evaporation Source 20 and Linear Opening 31: 60 cm
Substrate 10 Slide-Shifting Direction:
In a direction with the longer side of substrate 10 leading that makes the longitudinal orientation of substrate 10 and linear opening 31 intersect each other at 45° (Arrow A5 Direction)
Substrate 10 Slide-Shifting Speed: 26 cm/min
Layer Forming Speed: 10Å/sec
Substrate Temperature: Room temperature
Vacuum Level: $3.5 \times 1^{-6}$ torr The alignment layer formed under the above conditions has been uniform in layer thickness and layer growth direction.

Two substrates with the above alignment layer formed thereon have then been combined together to build a liquid crystal display device, and upon running similar drive tests thereon to those on Example 3, the threshold voltage has been found uniformly distributed over the entire substrate surface. The pretilt angle of liquid crystal molecules has also been found highly uniformly distributed at 42°.

EXAMPLE 5

An alignment layer has been formed by a similar process to Example 1, except for the below listed parameter changes.

Width of Linear Opening 31: 17 cm (Spacing D: 60 cm)
Angle $\theta1$: 6°
Angle $\theta2$: 8°
Substrate 10 Slide-Shifting Speed: 10.3 cm/min (with the slide-shifting direction remaining unchanged from Example 3)

The alignment layer formed under the above conditions has been uniform in both layer thickness and layer growth direction.

Two substrates each with the above alignment layer formed thereon have then been combined together to build a liquid crystal display device, and upon running drive tests thereon, the threshold voltage has been found uniformly distributed over the entire substrate surface. Upon measuring the pretilt angle of liquid crystal molecules, it has been found to be at 30° and highly uniformly distributed.

EXAMPLE 6

An alignment layer has been formed by a similar process to Example 5, except in a reverse substrate 10 slide-shifting direction. The alignment layer formed by the above process has been uniform in both layer thickness and layer growth direction.

Two substrates each with the above alignment layer formed thereon have then been combined together to build a liquid crystal display device, and upon running drive tests thereon similarly to Example 3, the threshold voltage has been found uniformly distributed over the entire sustrate surface. The liquid crystal molecular pretilt angle has also been found highly uniformly distributed at 35°.

EXAMPLE 7

Substrate 10

A glass substrate 12 cm long and 24 cm wide with an ITO-made clear electrode provided on its surface.
Linear Evaporation Source 20
Evaporation Depositing Material: SiO
Vessel: A tantalum container 15 mm deep with its opening 26 cm long and 1.5 mm wide
Control Member 30
A control member 9.8 cm wide having linear opening 31 made 26 cm long The above substrate 10, linear evaporation source 20, and control member 30 have been laid out similarly to those for Example 3, and in accordance with the below listed evaporation depositing conditions, an alignment layer has been formed on the substrate surface by a slanted vacuum evaporation depositing process.

Angle $\theta_1$: 30°
Angle $\theta_2$: 35°
Evaporation Depositing Directional Angle $\theta$: 45°
Spacing D between Linear Evaporation Source 10 and Linear Opening 31: 60 cm
Substrate 10 Slide-Shifting Direction:
Vertical to linear opening 31 (similarly to Example 3)
Substrate 10 Slide-Shifting Speed: 5.9 cm/min
Layer Forming Speed: 10Å/sec
Substrate Temperature: Room temperature
Vacuum Level: $3.5 \times 1^{-6}$ torr The alignment layer formed under the above conditions has been uniform in both layer thickness and layer growth direction.

Two substrates each with the above alignment layer formed thereon have then been combined together to build a liquid crystal display device, and upon running drive tests thereon, the threshold voltage has been found uniformly distributed over the entire substrate surface. Upon measuring the liquid crystal molecular pretilt angle, it has been found at 0° over the entire substrate surface at high uniformity.

COMPARATIVE EXAMPLE 2

An alignment layer has been formed by a process similar to that employed for Example 3, except replacing the linear evaporation source with a point evaporation source, using no control member, and fixing the substrate in position.

Two substrates each with the above alignment layer formed thereon have then been combined together to build a liquid crystal display device, and upon running drive tests thereon, the threshold voltage dispersions across the entire substrate surface have been revealed at 6% or greater.

COMPARATIVE EXAMPLE 3

An alignment layer has been formed by a process similar to that employed for Example 3, except replacing the linear evaporation source with a point evaporation source, laying substrate 10, control member 30, and point evaporation source 80 as shown in FIGS. 18 (A) and 18 (B) instead, and slide-shifting substrate 10 in the arrow mark A6-indicated direction instead.

Two substrates each with the above alignment layer formed thereon have then been combined together to build a liquid crystal display device, and upon running drive tests thereon, the threshold voltage dispersions across the entire substrate surface have been revealed at 3% or greater.

COMPARATIVE EXAMPLE 4

An alignment layer has been formed by a process similar to that employed for Example 3, except using no control member and fixing the substrate in position.

Two substrates each with the above alignment layer formed thereon have then been combined together, and upon running drive tests thereon, the threshold voltage dispersions across the entire substrate surface have been revealed at 3% or greater.

What is claimed is:

1. A substrate including an alignment layer useful in a liquid crystal display device fabricated by the steps of:
   disposing a linear source in a vacuum chamber, said linear source having a linear dimension and a center point substantially half-way along said linear dimension;
   disposing at least one substrate having a centerline, a center and a first surface in said vacuum chamber in fixed space relation to said linear source so that said first surface faces said linear source, said center line of the substrate is co-planar with said linear source, and said center of said substrate lies substantially along a line through said center of said linear source and perpendicular to said linear source, said substrate being rotated about said centerline to a desired angle $\theta$, and the linear dimension of said linear source and a linear dimension of said substrate projected onto said linear source being substantially equal;
   depositing material from said linear source onto said substrate.

2. A substrate made by the process recited in claim 1, wherein said step of depositing material from said linear source onto said substrate includes the steps of:
   drawing a vacuum in said vacuum chamber; and
   generating a flow of particles from said linear source.

3. A substrate made by the process recited in claim 1, wherein said step of disposing at least one substrate in fixed spaced relation to said linear source includes the step of disposing a plurality of substrates in fixed spaced relation to said linear source.

4. A substrate made by the process recited in claim 1, further comprising a step of heating said linear source to form a vapor from the material from said linear source until said vapor is deposited upon said substrate to form a deposition layer of a thickness on the order of 100 to 2500 Angstroms.

5. A substrate made by the process recited in claim 1, wherein said linear source is selected from the group including SiO, MgO, $MgF_2$, imide type polymers and amide type polymers.

6. A substrate including an alignment layer useful in a liquid crystal display device, the alignment layer being made by a process comprising:
   disposing a linear source in a vacuum chamber, said linear source having a linear dimension and a center point substantially half-way along said linear dimension;
   disposing a control member having at least one linear opening parallel to the linear source and having a center point so that a line connecting the center of the linear source and the center of the opening is perpendicular to the linear source;
   disposing at least one substrate having a centerline, a center and a first surface in said vacuum chamber in fixed spaced relation to said linear source and said opening, said opening being disposed between the substrate and the linear source;

moving the substrate relative to both the linear source and the control member, keeping the substrate parallel to the linear source and establishing a desired angle $\theta$ between a line connecting the center of the linear source to the center of the opening and the first surface of the substrate;

depositing material from said linear source onto said substrate.

7. A substrate made by the process recited in claim 6, wherein said step of depositing material from said linear source onto said substrate includes the steps of:

drawing a vacuum in said vacuum chamber; and generating a flow of particles from said linear source.

8. A substrate made by the process recited in claim 6, wherein said step of disposing at least one substrate in fixed spaced relation to said linear source includes the step of disposing a plurality of substrates in fixed spaced relation to said linear source, said control member having a plurality of openings.

9. A substrate made by the process recited in claim 6, further comprising a step of heating said linear source to form a vapor from the material from said linear source until said vapor is deposited upon said substrate to form a deposition layer of a thickness on the order of 100 to 2500 Angstroms.

10. A substrate made by the process recited in claim 6, wherein said linear source is selected from a group including SiO, MgO, MgF$_2$, imide-type polymers and amide-type polymers.

11. A substrate made by the process recited in claim 6, wherein said control member includes at least one directional control plate.

12. A substrate made by the process recited in claim 11, wherein said directional control plate is oriented vertically relative to said linear opening.

13. A method for fabricating an alignment layer on a substrate useful in a liquid crystal display device, the method comprising:

disposing a linear source in a vacuum chamber, said linear source having a linear dimension and a center point substantially half-way along said linear dimension;

disposing at least one substrate having a centerline, a center and a first surface in said vacuum chamber in fixed spaced relation to said linear source so that said first surface faces said linear source, said center line of the substrate is coplanar with said linear source, and said center of substrate lies substantially along a line through said center of said linear source and perpendicular to said linear source, said substrate being rotated about said centerline to a desired angle $\theta$, and the linear dimension of said linear source and a linear dimension of said substrate projected onto said linear source being substantially equal;

depositing material from said linear source onto said substrate.

14. A method as claimed in claim 13, wherein said step of depositing material from said linear source onto said substrate includes the steps of:

drawing a vacuum in said vacuum chamber; and generating a flow of particles from said linear source.

15. A method as claimed in claim 13, wherein said step of disposing at least one substrate in fixed spaced relation to said linear source includes the step of disposing a plurality of substrates in fixed spaced relation to said linear source.

16. A method as claimed in claim 13, wherein said step of disposing at least one substrate in said vacuum chamber includes disposing said substrate such that said substrate has a linear dimension projected on said linear source on the order of 0.8 to 1.2 times the linear dimension of said linear source.

17. A method as claimed in claim 13, wherein said step of disposing at least one substrate in said vacuum chamber includes the step of disposing said center line of said substrate at a distance from said linear source on the order of 2 to 6 times the linear dimension of said substrate projected onto said linear source.

18. A method as claimed in claim 13, wherein the step of disposing a linear source in a vacuum chamber includes the step of disposing an intermittent linear source.

19. A method as claimed in claim 13, further comprising a step of heating said linear source to form a vapor from the material from said linear source until said vapor is deposited upon said substrate to form a deposition layer of a thickness on the order of 100 to 2500 Angstroms.

20. A method as claimed in claim 13, further including the step of disposing a control member having a linear opening between said linear source and said substrate, said linear opening allowing the passage of vapor from said linear source.

21. A method as claimed in claim 20, wherein said linear source and said linear opening are disposed substantially parallel to each other.

22. A method as claimed in claim 13, wherein said linear source is selected from the group including SiO, MgO, MgF$_2$, imide type polymers and amide type polymers.

23. A method as claimed in claim 13, wherein said desired angle is in the range of 1 to 50 degrees.

24. A method as claimed in claim 23, wherein said desired angle is in the range of 5 to 15 degrees.

25. A method as claimed in claim 23, wherein said desired angle is in the range of 25 to 45 degrees.

26. A method for fabricating an alignment layer on a substrate useful in a liquid crystal display device, the method comprising:

disposing a linear source in a vacuum chamber, said linear source having a linear dimension and a center point substantially half-way along said linear dimension;

disposing a control member having at least one linear opening parallel to the linear source and having a center point so that a line connecting the center of the linear source and the center of the opening is perpendicular to the linear source;

disposing at least one substrate having a centerline, a center and a first surface in said vacuum chamber in fixed spaced relation to said linear source and said opening, said opening being disposed between the substrate and the linear source;

moving the substrate relative to both the linear source and the control member, keeping the substrate parallel to the linear source and establishing a desired angle $\theta$ between a line connecting the center of the linear source to the center of the opening and the first surface of the substrate;

depositing material from said linear source onto said substrate.

27. A method as claimed in claim 26, wherein said step of disposing at least one substrate in fixed relation to said linear source includes the step of disposing a plurality of substrates in fixed spaced relation to said linear source, said control member including a plurality of openings.

28. A method as claimed in claim 26, wherein said control member includes at least one directional control plate.

29. A method as claimed in claim 28, wherein said directional control plate is oriented vertically relative to said linear opening.

30. A method as claimed in claim 26, wherein said step of depositing material from said linear source onto said substrate includes the steps of:
drawing a vacuum in said vacuum chamber; and
generating a flow of particles from said linear source.

31. A method as claimed in claim 26, wherein said step of disposing at least one substrate in said vacuum chamber includes the step of disposing said substrate such that said substrate has a linear dimension projected on said linear source on the order of 0.8 to 1.2 times the linear dimension of said linear source.

32. A method as claimed in claim 26, wherein said step of disposing at least one substrate in said vacuum chamber includes the step of disposing said center line of said substrate at a distance from said linear source on the order of 2 to 6 times the linear dimension of said substrate projected onto said linear source.

33. A method as claimed in claim 26, wherein the step of disposing a linear source in a vacuum chamber includes the step of disposing an intermittent linear source.

34. A method as claimed in claim 26, further comprising a step of heating said linear source to form a vapor from the material from said linear source until said vapor is deposited upon said substrate to form a deposition layer of a thickness on the order of 100 to 2500 Angstroms.

35. A method as claimed in claim 26, wherein said linear source is selected from the group including SiO, MgO, MgF$_2$, imide type polymers and amide type polymers.

36. A method as claimed in claim 26, wherein said desired angle is in the range of 1 to 50 degrees.

37. A method as claimed in claim 36, wherein said desired angle is in the range of 5 to 15 degrees.

38. A method as claimed in claim 36, wherein said desired angle is in the range of 25 to 45 degrees.

39. An apparatus for fabricating an alignment layer on a substrate useful in a liquid crystal display device, the apparatus comprising:
linear source holding means for holding a linear source in a vacuum chamber, said linear source having a linear dimension and a centerpoint substantially half-way along its linear dimension;
substrate holding means for holding at least one substrate in said vacuum chamber in fixed spaced relation to said linear source, said substrate having a center line, a center and a first surface, said substrate holding means holding said substrate so that said first surface faces said linear source, said centerline of the substrate is co-planar with said linear source and said center of said substrate lies along a line through said center of said linear source and perpendicular to said linear source, the linear dimension of said linear source and a linear dimension of said substrate projected onto said linear source being substantially equal, and said substrate being rotated about said center line to a desired angle $\theta$;
means for drawing a vacuum in said vacuum chamber; and
means for generating a flow of particles from said linear source.

40. An apparatus as claimed in claim 39, wherein said substrate holding means includes means to hold a plurality of substrates.

41. An apparatus as claimed in claim 39, wherein said substrate has a maximum linear dimension projected on said linear surface on the order of 0.8 to 1.2 times the linear dimension of said linear source.

42. An apparatus as claimed in claim 39, wherein the distance between said linear source and said substrate at said centerline is on the order of 2 to 6 times the linear dimension of said substrate projected onto said linear source.

43. An apparatus as claimed in claim 39, wherein said linear source is an intermittent linear source.

44. An apparatus as claimed in claim 39, wherein said linear source is heated to form a vapor and said vapor is deposited on said substrate to form a deposition layer of a thickness on the order of 100 to 2500 Angstroms.

45. An apparatus as claimed in claim 39, further including a control member having a linear opening disposed between said linear source and said substrate, said linear opening allowing the passage of vapor from said linear source.

46. An apparatus as claimed in claim 45, wherein said linear source and said linear opening are disposed substantially parallel to each other.

47. An apparatus as claimed in claim 39, wherein said linear source is selected from the group including SiO, MgO, MgF$_2$, imide type polymers and amide type polymers.

48. An apparatus as claimed in claim 39, wherein said desired angle is in the range of 1 to 50 degrees.

49. An apparatus as claimed in claim 48, wherein said desired angle is in the range of 5 to 15 degrees.

50. An apparatus as claimed in claim 48, wherein said desired angle is in the range of 25 to 45 degrees.

51. An apparatus for fabricating an alignment layer on a substrate useful in a liquid crystal display device, the apparatus comprising:
a linear source disposed in a vacuum chamber having a linear dimension and a center point substantially half-way along said linear dimension;
a control member having at least one linear opening having a center point parallel to the linear source so that a line connecting the center of the linear source and the center of the opening is perpendicular to the linear source;
holding means for holding at least one substrate having a centerline, a center and a first surface in said vacuum chamber in fixed spaced relation to said linear source and said opening, said opening being disposed between the substrate and the linear source;
moving means for moving the holding means and the substrate relative to both the linear source and the control member, keeping the substrate parallel to the linear source and establishing a desired angle $\theta$ between a line connecting the center of the linear source to the center of the opening and the first surface of the substrate;

means for drawing a vacuum in said vacuum chamber, and means for generating a flow of particles from said linear source.

52. An apparatus as claimed in claim 51, wherein said control member has at least one directional control plate.

53. An apparatus as claimed in claim 52, wherein said directional control plate is oriented vertically relative to said opening.

54. An apparatus as claimed in claim 51, wherein said substrate holding means includes means to hold a plurality of substrates, said control member having a plurality of openings.

55. An apparatus as claimed in claim 51, wherein said substrate has a maximum linear dimension projected on said linear surface on the order of 0.8 to 1.2 times the linear dimension of said linear source.

56. An apparatus as claimed in claim 51, wherein the distance between said linear source and said substrate at said centerline is on the order of 2 to 6 times the linear dimension of said substrate projected onto said linear source.

57. An apparatus as claimed in claim 51, wherein said linear source is an intermittent linear source.

58. An apparatus as claimed in claim 51, wherein said linear source is selected from the group including SiO, MgO, MgF$_2$, imide type polymers and amide type polymers.

59. An apparatus as claimed in claim 51, wherein said desired angle is in the range of 1 to 50 degrees.

60. An apparatus as claimed in claim 59, wherein said desired angle is in the range of 5 to 15 degrees.

61. An apparatus as claimed in claim 59, wherein said desired angle is in the range of 25 to 45 degrees.

* * * * *